(12) United States Patent
Jiang et al.

(10) Patent No.: US 12,351,942 B2
(45) Date of Patent: *Jul. 8, 2025

(54) OXYGEN-DOPED GROUP III METAL NITRIDE AND METHOD OF MANUFACTURE

(71) Applicant: SLT Technologies, Inc., Los Angeles, CA (US)

(72) Inventors: Wenkan Jiang, Walnut, CA (US); Dirk Ehrentraut, Camas, WA (US); Mark P. D'Evelyn, Vancouver, WA (US)

(73) Assignee: SLT Technologies, Inc., Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/542,594

(22) Filed: Dec. 16, 2023

(65) Prior Publication Data

US 2024/0133076 A1 Apr. 25, 2024

Related U.S. Application Data

(60) Division of application No. 16/868,528, filed on May 6, 2020, now Pat. No. 11,898,269, which is a (Continued)

(51) Int. Cl.
C30B 29/40 (2006.01)
C01B 21/06 (2006.01)
(Continued)

(52) U.S. Cl.
CPC ........ *C30B 29/406* (2013.01); *C01B 21/0632* (2013.01); *C30B 7/105* (2013.01);
(Continued)

(58) Field of Classification Search
None
See application file for complete search history.

(56) References Cited

U.S. PATENT DOCUMENTS

| 7,078,731 B2 | 7/2006 | D'Evelyn et al. |
| 7,098,487 B2 | 8/2006 | D'Evelyn et al. |

(Continued)

FOREIGN PATENT DOCUMENTS

| JP | 2015-010023 A | 1/2015 |
| WO | 01/24921 A1 | 4/2001 |
| WO | 2004/053206 A1 | 6/2004 |

OTHER PUBLICATIONS

D'Evelyn et al., "Bulk GaN crystal growth by the high-pressure ammonothermal method", Journal of Crystal Growth 300 (2007) 11-16.

(Continued)

*Primary Examiner* — Michael Forrest
(74) *Attorney, Agent, or Firm* — Patterson + Sheridan, LLP

(57) ABSTRACT

A gallium-containing nitride crystals are disclosed, comprising: a top surface having a crystallographic orientation within about 5 degrees of a plane selected from a (0001) +c-plane and a (000-1) −c-plane; a substantially wurtzite structure; n-type electronic properties; an impurity concentration of hydrogen greater than about $5 \times 10^{17}$ cm$^{-3}$; an impurity concentration of oxygen between about $2 \times 10^{17}$ cm$^{-3}$ and about $1 \times 10^{20}$ cm$^{-3}$; an [H]/[O] ratio of at least 0.3; an impurity concentration of at least one of Li, Na, K, Rb, Cs, Ca, F, and Cl greater than about $1 \times 10^{16}$ cm$^{-3}$; a compensation ratio between about 1.0 and about 4.0; an absorbance per unit thickness of at least 0.01 cm$^{-1}$ at wavenumbers of approximately 3175 cm$^{-1}$, 3164 cm$^{-1}$, and 3150 cm$^{-1}$; and wherein, at wavenumbers between about 3200 cm$^{-1}$ and about 3400 cm$^{-1}$ and between about 3075 cm$^{-1}$ and about 3125 cm$^{-1}$, said gallium-containing nitride crystal is essentially free of infrared absorption peaks having an (Continued)

absorbance per unit thickness greater than 10% of the absorbance per unit thickness at 3175 cm.

20 Claims, 10 Drawing Sheets

Related U.S. Application Data continuation of application No. 15/865,391, filed on Jan. 9, 2018, now Pat. No. 10,648,102.

(60) Provisional application No. 62/444,171, filed on Jan. 9, 2017.

(51) Int. Cl.
 *C30B 7/10* (2006.01)
 *H10D 62/50* (2025.01)
 *H10D 62/85* (2025.01)

(52) U.S. Cl.
 CPC ......... *H10D 62/50* (2025.01); *H10D 62/8503* (2025.01); *C01P 2002/30* (2013.01); *C01P 2002/74* (2013.01); *C01P 2002/80* (2013.01); *C01P 2006/80* (2013.01)

(56) References Cited

U.S. PATENT DOCUMENTS

| | | | |
|---|---|---|---|
| 9,543,392 B1 | 1/2017 | Jiang et al. | |
| 10,648,102 B2* | 5/2020 | Jiang | H01L 29/2003 |
| 11,898,269 B2* | 2/2024 | Jiang | C30B 29/406 |
| 2003/0183155 A1 | 10/2003 | D'Evelyn et al. | |
| 2004/0245535 A1 | 12/2004 | D'Evelyn et al. | |
| 2005/0087753 A1 | 4/2005 | D'Evelyn et al. | |
| 2013/0108537 A1 | 5/2013 | Mikawa et al. | |
| 2015/0155439 A1* | 6/2015 | Cich | H01L 33/16 |
| | | | 362/296.09 |

OTHER PUBLICATIONS

Suihkonen et al., "Infrared absorption of hydrogen-related defects in ammonothermal GaN", Applied Physics Letters 108, 202105 (2016).
International Search Report dated Dec. 6, 2008 for Application No. PCT/US2008/000304.

* cited by examiner

OXYGEN-DOPED GROUP III METAL NITRIDE AND METHOD OF MANUFACTURE

CROSS-REFERENCE TO RELATED APPLICATIONS

This application is a divisional of U.S. patent application Ser. No. 16/868,528, which is a continuation of co-pending U.S. patent application Ser. No. 15/865,391, filed Jan. 9, 2018, which claims benefit of U.S. provisional patent application Ser. No. 62/444,171, filed Jan. 9, 2017. Each of the aforementioned related patent applications is herein incorporated by reference.

BACKGROUND

Field

This disclosure relates to large-area, low-cost single crystal n-type gallium-containing nitride crystals useful as substrates for fabricating GaN devices for electronic and/or optoelectronic applications.

The present invention generally relates to processing of materials for growth of crystals. More particularly, the present invention provides an n-type gallium-containing nitride crystal synthesized by an ammonobasic or ammonoacidic technique. The present invention provides methods suitable for synthesis of crystalline nitride materials, as well as other crystals and materials. Such crystals and materials include, but are not limited to, GaN, AlN, InN, InGaN, AlGaN, and AlInGaN, and for manufacture of bulk substrates. Such bulk substrates can be used for a variety of applications including optoelectronic devices, lasers, light emitting diodes, solar cells, photoelectrochemical water splitting and hydrogen generation, photodetectors, integrated circuits, and transistors.

Gallium nitride containing crystalline materials serve as substrates for manufacture of conventional optoelectronic and electronic devices, such as blue light emitting diodes, lasers, power diodes, and transistors. Such optoelectronic and electronic devices have been commonly manufactured on sapphire, silicon, or silicon carbide substrates that differ in composition from the deposited nitride layers. In the conventional Metal-Organic Chemical Vapor Deposition (MOCVD) method, deposition of GaN is performed from ammonia and organometallic compounds in the gas phase. Although successful, conventional growth rates achieved make it difficult to provide a bulk layer of GaN material. Additionally, dislocation densities are also high and lead to poorer optoelectronic device performance.

For many applications an n-type GaN substrate is desirable, having excellent crystalline and electrical properties and low cost. Quasi-bulk GaN substrates grown by hydride vapor phase epitaxy (HVPE) often do quite well in this regard but a number of improvements are desirable, as described below.

What is needed is a method for low-cost manufacturing of n-type nitride materials that have excellent crystallographic and electrical properties. The present invention fulfils this need among others.

SUMMARY

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

One aspect of the invention is synthesizing n-type ammonothermal c-plane GaN with a compensation ratio equal to or greater than 1.0, and consistently lower than 4.0. By way of background, for many classes of GaN-based devices, an n-type substrate is preferred. It is desirable to be able to control the carrier concentration over several orders of magnitude, as different levels are preferred in different applications. For a given carrier concentration, it is generally desirable that the carrier mobility is as high as possible, and the resistivity be as low as possible. However, scattering of carriers by various types of defects can reduce carrier mobilities. In addition, certain types of defects can cause compensation of dopants, with the consequence that the carrier concentration is significantly below the dopant concentration. The compensation ratio may be defined as the ratio of the dopant concentration to the carrier concentration. Self-compensation, that is, the unintentional incorporation of defects with p-type electrical properties in parallel with intentional incorporation of n-type dopants such as oxygen, silicon, or germanium may cause the compensation ratio to be considerably larger than one. In GaN grown by hydride vapor phase epitaxy (HVPE), it is common for the compensation ratio to be relatively close to one, particularly with Si-doped GaN. However, HVPE GaN substrates are typically relatively expensive, and commercially available HVPE GaN substrates typically have other limitations, including threading dislocation densities on the order of $10^6$-$10^7$ cm$^{-2}$, residual stresses, and crystallographic miscut angles that may vary over the surface by 0.1 to 1 degree, that are undesirable for various device applications. GaN substrates grown by ammonothermal methods, by contrast, have demonstrated significantly lower concentrations of threading dislocation density, residual stress, and variations in crystallographic miscut angles but often suffer from higher compensation ratios.

Applicants have discovered growth conditions that, surprisingly, consistently produce n-type ammonothermal GaN with a compensation ratio between 1.5 and 3.5 despite a wide range of oxygen concentrations. The optical absorption coefficient, by contrast, is found to be closely and positively correlated with oxygen concentration, suggesting that the defect(s) giving rise to partial compensation of the oxygen donors also gives rise to optical absorption. Without wishing to be limited by theory, the inventors believe that these compensating defects comprise one or more of singly and doubly hydrogenated Ga vacancies and Ga vacancies complexed with both oxygen and hydrogen ($V_{Ga}$—H, $V_{Ga}$—H$_2$, $V_{Ga}$—O—H, $V_{Ga}$—O-2H). Furthermore, these compensating defects appear to be associated with a particular set of infrared absorption features that are unexpected, as compared to the prior art.

Regarding infrared absorption features in ammonothermally-grown GaN, D'Evelyn et al., in U.S. Pat. No. 7,078,731, taught the synthesis of GaN crystals with an optical absorption coefficient less than 5 cm$^{-1}$ between wavelengths of 465 nanometers and 700 nanometers. The D'Evelyn patent teaches four types of hydrogenated gallium-vacancy defects ($V_{Ga}H_1$, $V_{Ga}H_2$, $V_{Ga}H_3$ and $V_{Ga}H_4$) but does not have specific teaching about the relationship between the defect concentrations and transparency in visible wavelengths nor does it provide any indication of the relationship between crystallographic growth sector and transparency or electrical properties. Other references suggest that the presence of oxygen, in particular, is deleterious to transparency. In strongly n-type GaN, the most stable charge states for these hydrogen- and hydrogen-oxygen complexes are predicted to be $V_{Ga}$—H$^{2-}$, $V_{Ga}$-2H$^-$, $V_{Ga}$-3H$^0$, $V_{Ga}$—O—H$^-$, and $V_{Ga}$—O-2H$^0$. Negatively-charged complexes can be formed by localization of an electron donated by a substitutional oxygen dopant on a nitrogen site ($O_N$), that is, by compensation of an oxygen donor. The neutral $V_{Ga}$-3H complex would not be expected to act as a compensating acceptor, but the $V_{Ga}$—O-2H complex, while not acting as a compensating acceptor, would nonetheless have the property of accommodating an oxygen atom without donating an electron to the conduction band. However, to the best of our knowledge, the infrared spectra of Ga-vacancy-oxygen-hydrogen complexes have not yet been predicted by theoretical calculations.

We find, surprisingly, that there may be six (6) or even more types of defects associated with partially-hydrogenated gallium vacancies and/or gallium-vacancy-oxygen complexes in ammonothermal GaN that may play a critical role in defining the compensating centers in ammonothermal GaN and the associated compensation ratio. We have discovered that, at least in some cases, the relative intensities of these peaks may be manipulated in such a way so as to produce ammonothermal GaN with a narrowly-defined compensation ratio. The well-defined compensation ratio is desirable from the standpoint of accurately controlling the electrical properties of the crystals, which tends to be important for device applications.

In one embodiment, the invention relates to forming gallium-containing nitride crystals by controlling dopant and impurity concentrations during ammonothermal growth and processing to control the types and relative concentrations of point defect species. For example, in one embodiment, the gallium-containing nitride crystal comprises: (a) a gallium-containing nitride in a substantially wurtzite structure; (b) a compensation ratio between about 1.0 and about 4.0; (c) an absorbance per unit thickness of at least 0.01 cm$^{-1}$ at wavenumbers of approximately 3175 cm$^{-1}$, 3164 cm$^{-1}$, and 3150 cm$^{-1}$; and (d) wherein, at wavenumbers between about 3200 cm$^{-1}$ and about 3400 cm$^{-1}$ and between about 3075 cm$^{-1}$ and about 3125 cm$^{-1}$, said gallium-containing nitride crystal is essentially free of infrared absorption peaks having an absorbance per unit thickness greater than 10% of the absorbance per unit thickness at 3175 cm$^{-1}$.

In another embodiment, the gallium-containing nitride crystals comprises: a top surface having a crystallographic orientation within about 5 degrees of a plane selected from a (0001) +c-plane and a (000-1) −c-plane; a substantially wurtzite structure; n-type electronic properties; an impurity concentration of hydrogen greater than about $5 \times 10^{17}$ cm$^{-3}$; an impurity concentration of oxygen between about $2 \times 10^{17}$ cm$^{-3}$ and about $1 \times 10^{20}$ cm$^{-3}$; an [H]/[O] ratio of at least 0.3; an impurity concentration of at least one of Li, Na, K, Rb, Cs, Ca, F, and Cl greater than about $1 \times 10^{16}$ cm$^{-3}$; a compensation ratio between about 1.0 and about 4.0; an absorbance per unit thickness of at least 0.01 cm$^{-1}$ at wavenumbers of approximately 3175 cm$^{-1}$, 3164 cm$^{-1}$, and 3150 cm$^{-1}$; and wherein, at wavenumbers between about 3200 cm$^{-1}$ and about 3400 cm$^{-1}$ and between about 3075 cm$^{-1}$ and about 3125 cm$^{-1}$, said gallium-containing nitride crystal is essentially free of infrared absorption peaks having an absorbance per unit thickness greater than 10% of the absorbance per unit thickness at 3175 cm$^{-1}$.

In another embodiment, gallium-containing nitride crystals are provided, comprising: a top surface having a crystallographic orientation within about 5 degrees of a plane selected from a (0001) +c-plane and a (000-1) −c-plane; a substantially wurtzite structure; n-type electronic properties; an impurity concentration greater than about $5 \times 10^{17}$ cm$^{-3}$ of hydrogen; an impurity concentration between about $2 \times 10^{17}$ cm$^{-3}$ and about $4 \times 10^{18}$ cm$^{-3}$ of oxygen; an H/O ratio of at least 0.3; an impurity concentration greater than about $1 \times 10^{16}$ cm$^{-3}$ of at least one of Li, Na, K, Rb, Cs, Ca, F, and Cl; an optical absorption coefficient less than about 8 cm$^{-1}$ at a wavelength of 400 nanometers; an optical absorption coefficient less than about 6 cm$^{-1}$ at a wavelength of 410 nanometers; an optical absorption coefficient less than about 5.5 cm$^{-1}$ at a wavelength of 415 nanometers; an optical absorption coefficient less than about 4 cm$^{-1}$ at a wavelength of 450 nanometers; an absorbance per unit thickness of at least 0.01 cm$^{-1}$ at wavenumbers of approximately 3175 cm$^{-1}$, 3164 cm$^{-1}$, and 3150 cm$^{-1}$; no infrared absorption peaks at wavenumbers between about 3200 cm$^{-1}$ and about 3400 cm$^{-1}$ or between about 3075 cm$^{-1}$ and about 3125 cm$^{-1}$ having an absorbance per unit thickness greater than 10% of the absorbance per unit thickness at 3175 cm$^{-1}$.

In yet another embodiment, gallium-containing nitride crystals are provided, comprising: a top surface having a crystallographic orientation within about 5 degrees of a {1 0 -1 0} m-plane; a substantially wurtzite structure; n-type electronic properties; an impurity concentration greater than about $3 \times 10^{18}$ cm$^{-3}$ of hydrogen; an impurity concentration between about $5 \times 10^{17}$ cm$^{-3}$ and about $3 \times 10^{19}$ cm$^{-3}$ of oxygen; an H/O ratio of at least 1.1; an impurity concentration greater than about $1 \times 10^{16}$ cm$^{-3}$ of at least one of Li, Na, K, Rb, Cs, Ca, F, and Cl; an optical absorption coefficient less than about 8 cm$^{-1}$ at a wavelength of 400 nanometers; an optical absorption coefficient less than about 6 cm$^{-1}$ at a wavelength of 410 nanometers; an optical absorption coefficient less than about 5.5 cm$^{-1}$ at a wavelength of 415 nanometers; an optical absorption coefficient less than about 4 cm$^{-1}$ at a wavelength of 450 nanometers; an absorbance per unit thickness of at least 0.01 cm$^{-1}$ at 3188 cm$^{-1}$, 3175 cm$^{-1}$, 3164 cm$^{-1}$, and 3150 cm$^{-1}$; and no infrared absorption peaks at wavenumbers between about 3125 cm$^{-1}$ and about 3000 cm$^{-1}$, having an absorbance per unit thickness greater than 10% of the absorbance per unit thickness at 3188 cm$^{-1}$.

BRIEF DESCRIPTION OF THE DRAWINGS

Those skilled in the art will understand that the drawings, described herein, are for illustration purposes only. The drawings are not intended to limit the scope of the present disclosure.

DETAILED DESCRIPTION

Figure 1:
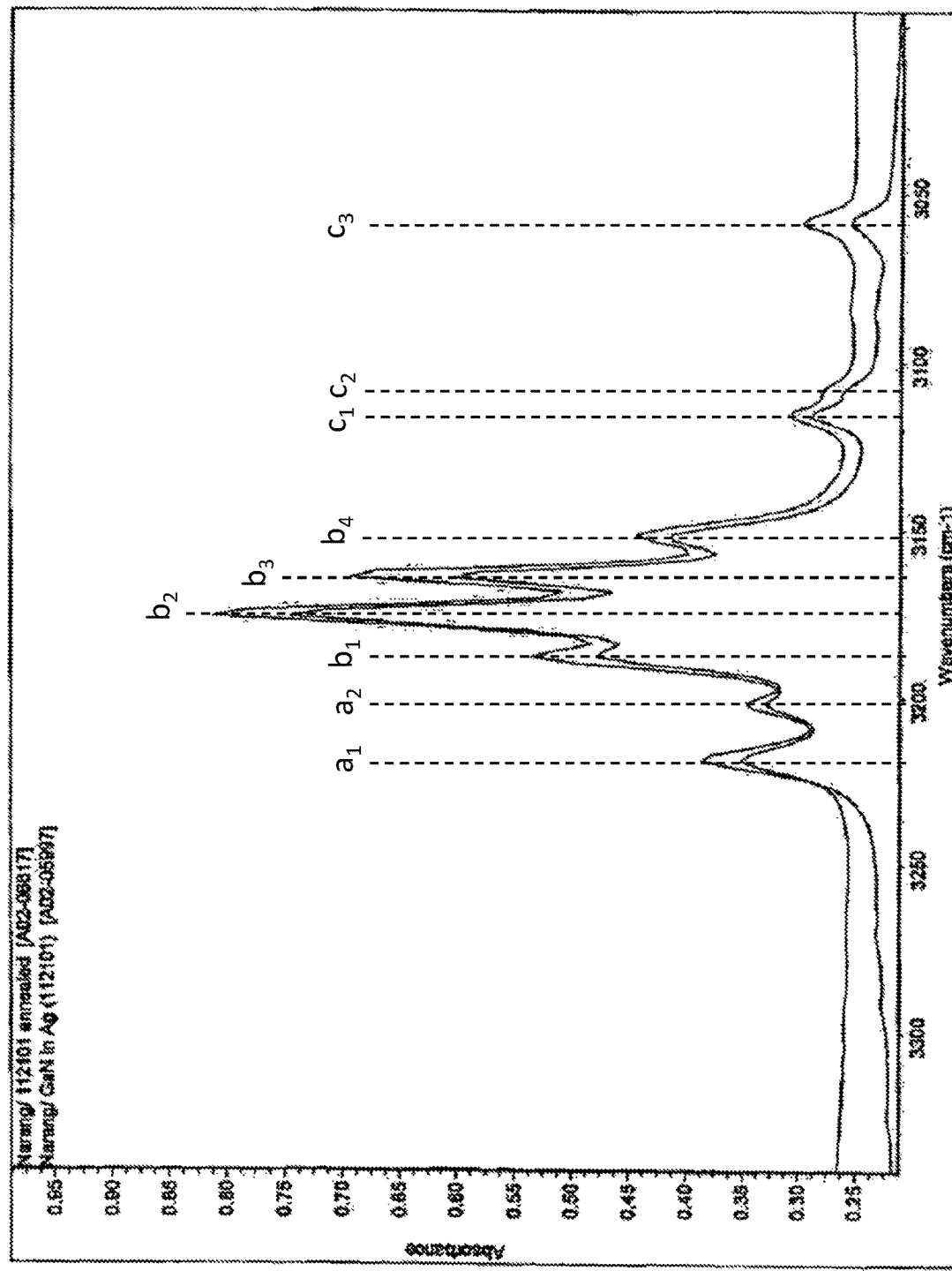
FIG. 1 shows infrared spectra of a gallium-containing nitride according to the prior art.

Approximating language, as used herein throughout the specification and claims may be applied to modify any quantitative representation that could permissibly vary without resulting in a change in the basic function to which it may be related. Accordingly, a value modified by a term such as "about" is not limited to the precise value specified. In at least one instance, the variance indicated by the term "about" may be determined with reference to the precision of the measuring instrumentation. Similarly, "free" may be combined with a term; and may include an insubstantial number, or a trace amount, while still being considered free of the modified term unless explicitly stated otherwise.

The metal of a metal nitride may include a group III metal. Suitable metals may include aluminum, gallium, and indium. The term "one or more" refers to combinations of metals in the metal nitride, and may include compositions such as aluminum gallium nitride (AlGaN) and the like. As used herein, the term "gallium nitride" will be used as an illustrative example of a metal nitride, but it is understood that other group III metal nitrides are also possible.

A metal nitride composition may contain impurities. As used herein, the term "impurity" refers to a chemical species that is distinct from the group III metal nitride that constitutes the majority composition of the single-crystal or polycrystalline metal nitride. Several classes of impurities may be distinguished with respect to chemistry, atomic structure, intent, and effect. Impurities will generally comprise elements distinct from nitrogen, aluminum, gallium, and indium, including oxygen, carbon, halogens, hydrogen, alkali metals, alkaline earth metals, transition metals, and main block elements. The impurity may be present in a number of forms with different atomic structure. In some cases, the impurity is present as an isolated atom or ion within the crystalline lattice of the group III metal nitride, for example, as a substitutional or interstitial impurity. In other cases, the impurity is present in a distinct phase, for example, as an inclusion within an individual group III metal nitride grain or within a grain boundary of the group III metal nitride. The impurity may be deliberately added to enhance the properties of the group III metal nitride in some way, or may be unintentional. Finally, the impurity may or may not have a significant effect on the electrical, crystallographic, chemical, or mechanical properties of the group III metal nitride.

As used herein, and as is commonly used in the art, the term "dopant" refers to an impurity that is atomically dispersed within the group III metal nitride, for example, as a substitutional impurity, and which is typically added intentionally. With regard to dopants and dopant precursors (collectively "dopants" unless otherwise indicated), the electrical properties of the group III metal nitride composition may be controlled by adding one or more of such dopants to the above composition during processing. The dopant may also provide magnetic and/or luminescent properties to the group III metal nitride composition. Suitable dopants may include one or more of s or p block elements, transition metal elements, and rare earth elements. Suitable s and p block elements include, for example, silicon, germanium, magnesium, and tin. Other suitable dopants may include transition group elements. Suitable transition group elements include, for example, zinc, iron, or cobalt. Suitable dopants may produce an n-type material, a p-type material, or a semi-insulating material. In some embodiments, oxygen, whether added intentionally or unintentionally, also acts as a dopant.

Suitable dopant concentration levels in a single-crystal or polycrystalline composition may be greater than about $10^{10}$ atoms per cubic centimeter. In one embodiment, the dopant concentration may be in a range of from about $10^{10}$ atoms per cubic centimeter to about $10^{15}$ atoms per cubic centimeter, from about $10^{15}$ atoms per cubic centimeter to about $10^{16}$ atoms per cubic centimeter, from about $10^{16}$ atoms per cubic centimeter to about $10^{17}$ atoms per cubic centimeter, from about $10^{17}$ atoms per cubic centimeter to about $10^{18}$ atoms per cubic centimeter, from about $10^{18}$ atoms per cubic centimeter to about $10^{21}$ atoms per cubic centimeter, or greater than about $10^{21}$ atoms per cubic centimeter.

For many classes of GaN-based devices, an n-type substrate is preferred. It is desirable to be able to control the carrier concentration over several orders of magnitude, as different levels are preferred in different applications. For a given carrier concentration, it is generally desirable that the carrier mobility is as high as possible, and the resistivity be as low as possible. However, scattering of carriers by various types of defects can reduce carrier mobilities. In addition, certain types of defects can cause compensation of dopants, with the consequence that the carrier concentration is significantly below the dopant concentration. The compensation ratio may be defined as the ratio of the dopant concentration to the carrier concentration. Self-compensation, that is, the unintentional incorporation of defects with p-type electrical properties in parallel with intentional incorporation of n-type dopants such as oxygen, silicon, or germanium may cause the compensation ratio to be considerably larger than one. In GaN grown by hydride vapor phase epitaxy (HVPE), it is common for the compensation ratio to be relatively close to one, particularly with Si-doped GaN. However, HVPE GaN substrates are typically relatively expensive, and commercially available HVPE GaN substrates typically have other limitations, including threading dislocation densities on the order of $10^6$-$10^7$ cm$^{-2}$, residual stresses, and crystallographic miscut angles that may vary over the surface by 0.1 to 1 degree, that are undesirable for various device applications. GaN substrates grown by ammonothermal methods, by contrast, have demonstrated significantly lower concentrations of threading dislocation density, residual stress, and variations in crystallographic miscut angles but often suffer from higher compensation ratios. In addition, in general, the electrical properties of GaN crystals depend on the crystallographic growth sector. For example, Pimputkar et al. [Journal of Crystal Growth 432, 49 (2015)] reported that ammonobasic GaN grown on the Ga-face of a c-plane seed crystal had an oxygen concentration of about $4.5 \times 10^{19}$ cm$^{-3}$ and a carrier concentration of $9.2 \times 10^{18}$ cm$^{-3}$, implying a compensation ratio of about 5. The same authors reported that ammonobasic GaN grown on the N-face of a c-plane seed crystal had an oxygen concentration of about $7.5 \times 10^{19}$ cm$^{-3}$ and a carrier concentration of $6 \times 10^{18}$ cm$^{-3}$, implying a compensation ratio greater than 12. The same authors reported values of the Hall mobility of these two crystals as approximately 5 and 60 cm$^{2/V}$-sec, respectively, significantly lower than the Hall mobility of HVPE or MOCVD GaN with a similar carrier concentration. Similarly, Suihkonen, et al. [Applied Physics Letters 108, 202105 (2016)] reported c-plane ammonobasic GaN with an oxygen concentration of about $2 \times 10^{19}$ cm$^{-3}$ and a carrier concentration of $1.5 \times 10^{18}$ cm$^{-3}$, implying a compensation ratio of about 13. Uedono, et al. [Journal of Crystal Growth 448, 117 (2016) reported c-plane ammonoacidic GaN with an oxygen concentration of about $8 \times 10^{17}$ cm$^{-3}$ and a carrier concentration of $1.3 \times 10^{17}$ cm$^{-3}$, implying a compensation ratio of about 6. By contrast, Mikawa, et al., [U.S. Patent Application No. 2013/0108537] reported m-plane ammonoacidic GaN with oxygen concentrations between $1.5 \times 10^{18}$ cm$^{-3}$ and $8 \times 10^{17}$ cm$^{-3}$, carrier concentrations between $6.7 \times 10^{17}$ cm$^{-3}$ and $8 \times 10^{17}$ cm$^{-3}$, implying compensation ratios between 1.1 and 4.1. It is an object of the current invention to synthesize n-type ammonothermal c-plane GaN with compensation ratios equal to or greater than 1.0, or greater than 1.5, and consistently lower than 4.0, lower than 3.5, or lower than 3.0.

Applicants have discovered growth conditions that, surprisingly, consistently produce n-type ammonothermal GaN with a compensation ratio between 1.5 and 3.5 despite a wide range of oxygen concentrations. The optical absorption coefficient, by contrast, is found to be closely and positively correlated with oxygen concentration, suggesting that the defect(s) giving rise to partial compensation of the oxygen donors also gives rise to optical absorption. Without wishing to be limited by theory, the inventors believe that these compensating defects comprise one or more of singly and doubly hydrogenated Ga vacancies and Ga vacancies complexed with both oxygen and hydrogen ($V_{Ga}$—H, $V_{Ga}$—H$_2$, $V_{Ga}$—O—H, $V_{Ga}$—O-2H). Furthermore, these compensating defects appear to be associated with a particular set of infrared absorption features that are unexpected, as compared to the prior art.

Regarding infrared absorption features in ammonothermally-grown GaN, D'Evelyn et al., in U.S. Pat. No. 7,078,731, taught the synthesis of GaN crystals with an optical absorption coefficient less than 5 cm$^{-1}$ between wavelengths of 465 nanometers and 700 nanometers. Precise values of the optical absorption coefficient were not reported but the same authors reported photographs of crystals having a pronounced yellowish tint (D'Evelyn et al., "Bulk GaN crystal growth by the high pressure ammonothermal method," Journal of Crystal Growth 300, 11 (2007)], implying significant optical absorption at blue-to-violet wavelengths. These authors also reported infrared spectra with a series of absorption features between 3000 and 3250 cm$^{-1}$, whose intensities were reported to be insensitive to annealing. The most intense peak, at about 3175 cm$^{-1}$, had an absorbance, relative to the baseline, of about 0.6. Assuming a crystal thickness of about 400 microns, this corresponds to an absorbance per unit thickness of about 15 cm$^{-1}$. These infrared spectra are shown in FIG. 1, with newly-added peak designations, and provide a point of comparison to the unexpected findings of the present invention. Eight infrared peaks, with a designation and peak wavenumber as reported in Table 1, were extracted from FIG. 8 in U.S. Pat. No. 7,078,731. Quoting from the U.S. Pat. No. 7,078,731 patent, with the exceptions of the insertions enclosed within brackets, "Based on predictions of vibrational frequencies of 3100-3470 cm$^{-1}$ for $V_{Ga}H_1$—$V_{Ga}H_4$ (which may overestimate the actual frequencies by about 200 cm$^{-1}$) and the observation of infrared absorption features at 3020-3050 cm$^{-1}$ and at 3140 cm$^{-1}$ in hydrogen-implanted GaN (Weinstein et al., Appl. Phys. Lett. 72, 1703 (1998)), we believe that the absorption peaks between 3150 and 3200 cm$^{-1}$ (i.e., peaks a$_2$ and b$_1$-b$_4$ in Table 1) in our samples correspond to $V_{Ga}H_3$ and $V_{Ga}H_4$, that the absorption peaks observed between 3000 and 3150 cm$^{-1}$ (i.e., peaks c$_1$-c$_3$) in both our crystal and hydrogen-implanted GaN correspond to $V_{Ga}H_1$ and $V_{Ga}H_2$, and that other minor peaks may be associated with the presence of other impurities or defects. Thus, the presence of an infrared absorption feature near 3175 cm$^{-1}$ in GaN crystals grown by the method described herein indicates passivation of gallium vacancies, and the persistence of the infrared feature upon high temperature annealing indicates that this passivation is quite stable." Similar infrared peaks have been reported more recently by Suihkonen et al. [S. Suihkonen, S. Pimputkar, and J. S. Speck, 108, 202105 (2016)].

TABLE 1

Designation and peak wavenumber values of peaks in infrared spectra of ammonothermally-grown bulk GaN crystals.

| Peak Designation | Peak Wavenumber (cm$^{-1}$) U.S. Pat. No. 7,078,731 | Peak Wavenumber (cm$^{-1}$) Present Invention |
| --- | --- | --- |
| a$_1$ | 3218 | 3218 |
| a$_2$ | 3201 | 3202 |
| b$_1$ | 3187 | 3188 |
| b$_2$ | 3174 | 3175 |
| b$_3$ | 3163 | 3164 |
| b$_4$ | 3151 | 3150 |
| c$_1$ | 3115 | 3115 |
| c$_2$ | 3108 | 3108 |
| c$_3$ | 3058 | 3058 |
| c$_4$ | — | 3046 |

The D'Evelyn patent teaches four types of hydrogenated gallium-vacancy defects ($V_{Ga}H_1$, $V_{Ga}H_2$, $V_{Ga}H_3$ and $V_{Ga}H_4$) but does not have specific teaching about the relationship between the defect concentrations and transparency in visible wavelengths nor does it provide any indication of the relationship between crystallographic growth sector and transparency or electrical properties. Other references suggest that the presence of oxygen, in particular, is deleterious to transparency. Van de Walle taught that the energy levels of bare Ga vacancies and mono- and di-hydrogenated Ga vacancies lie within the bandgap and therefore would be expected to give rise to sub-bandgap optical absorption, whereas the energy levels of tri- and tetra-hydrogenated Ga vacancies lay close to or within the valence band and therefore should have less or no impact on optical absorption. Van de Walle, "Interactions of hydrogen with native defects in GaN," Phys. Rev. B 56, R10020-R10023 (1997). More recently, Van de Walle and co-workers taught that gallium-vacancy-oxygen-hydrogen complexes ($V_{Ga}$—O—H, $V_{Ga}$—O-2H) have formation energies that are even more favorable than those of gallium-vacancy-hydrogen-only complexes in n-type GaN [J. L. Lyons, et al., "First-principles theory of acceptors in nitride semiconductors," Phys. Stat. Solidi B 252, 900 (2015); C. E. Dreyer, et al., "Gallium vacancy complexes as a cause of Shockley-Read-Hall recombination in III-nitride light emitters," Appl. Phys. Lett. 108, 141101 (2016)]. In strongly n-type GaN, the most stable charge states for these hydrogen- and hydrogen-oxygen complexes are predicted to be $V_{Ga}$—$H^{2-}$, $V_{Ga}$-$2H^-$, $V_{Ga}$-$3H^0$, $V_{Ga}$—O—$H^-$, and $V_{Ga}$—O-$2H^0$. Negatively-charged complexes can be formed by localization of an electron donated by a substitutional oxygen dopant on a nitrogen site ($O_N$), that is, by compensation of an oxygen donor. The neutral $V_G$-3H complex would not be expected to act as a compensating acceptor, but the $V_{Ga}$—O-2H complex, while not acting as a compensating acceptor, would nonetheless have the property of accommodating an oxygen atom without donating an electron to the conduction band. However, to the best of our knowledge, the infrared spectra of Ga-vacancy-oxygen-hydrogen complexes have not yet been predicted by theoretical calculations.

We find, surprisingly, that there may be six (6) or even more types of defects associated with partially-hydrogenated gallium vacancies and/or gallium-vacancy-oxygen complexes in ammonothermal GaN that may play a critical role in defining the compensating centers in ammonothermal GaN and the associated compensation ratio. Referring to Table 1, peaks $c_3$ and $c_4$ (the latter may be visible only when the former is relatively prominent) vary in intensity differently than the other peaks and seem clearly to be due to a distinct species. Similarly, peaks $c_1$ and $c_2$ vary in intensity differently than the other peaks and seem clearly to be due to a different, distinct species. The relative intensities of peaks $b_2$ and $b_3$ typically remain constant from sample to sample, and therefore these probably result from a single defect species. However, the relative intensity of peak $b_4$ to peaks $b_2$ and $b_3$ varies between different samples and therefore may be due to a different defect species. Peak $b_1$ sometimes appears together with peaks $b_2$-$b_4$ but sometimes appears without these peaks and therefore likely results from a distinct species. The relative intensities of peaks $a_1$ and $a_2$, when present, typically remain constant from sample to sample and therefore result from a single species, but these peaks are absent from some samples where one or more of peaks $b_1$-$b_4$ are present and so result from a separate defect. We have discovered that, at least in some cases, the relative intensities of these peaks may be manipulated in such a way so as to produce ammonothermal GaN with a narrowly-defined compensation ratio. The well-defined compensation ratio is desirable from the standpoint of accurately controlling the electrical properties of the crystals, which tends to be important for device applications.

A high-quality oxygen-doped, n-type gallium nitride or metal nitride crystal or wafer may be manufactured cost-effectively by the following method.

One or more high-quality gallium nitride seed crystals or plates may be provided. The seed plates may have a minimum lateral dimension of at least one centimeter. In some embodiments, the seed plates have a maximum lateral dimension of at least two centimeters and a minimum lateral dimension of at least one centimeter. In other embodiments, the seed plates have minimum lateral dimensions of at least three centimeters, at least four centimeters, at least five centimeters, at least six centimeters, at least eight centimeters, or at least ten centimeters. In some embodiments, the seed plates are bulk single crystals of gallium nitride. In some embodiments the seed plates are prepared from crystals that were grown by hydride vapor phase epitaxy. In other embodiments, the seed plates are prepared from crystals that were grown ammonothermally. In still other embodiments, the seed plates are prepared from crystals that were grown from solution in a flux. In some embodiments, the dislocation density at the large-area surfaces of the seed plates is less than about $10^7$ $cm^{-2}$. In some embodiments, the dislocation density at the large-area surfaces of the seed plates is less than about $10^6$ $cm^{-2}$, less than about $10^5$ $cm^{-2}$, less than about $10^3$ $cm^{-2}$, less than about $10^3$ $cm^{-2}$, or less than about $10^{-2}$ $cm^{-2}$. In some embodiments, the full width at half maximum of the lowest-order x-ray diffraction line corresponding to the crystallographic orientation of the large-area face is less than 300 arc seconds, less than 150 arc seconds, less than 100 arc seconds, less than 50 arc seconds, less than 40 arc seconds, less than 30 arc seconds, or less than 20 arc seconds.

In one specific embodiment, the orientation of the large-area surfaces of the seed plates is within about 5 degrees, within about 2 degrees, within about 1 degree, within about 0.5 degree, within about 0.2 degree, or within about 0.1 degree of a {1 0 –1 0} m-plane. In another specific embodiment, the orientation of the large-area surfaces of the seed plates is within about 5 degrees, within about 2 degrees, within about 1 degree, within about 0.5 degree, within about 0.2 degree, or within about 0.1 degree of a (0 0 0 ±1) c-plane. In another specific embodiment, the orientation of the large-area surfaces of the seed plates is within about 5 degrees, within about 2 degrees, within about 1 degree, within about 0.5 degree, within about 0.2 degree, or within about 0.1 degree of a {1 1 –2 0} a-plane. In some embodiments, the seed plate has a semi-polar large-surface orientation, which may be designated by (hkil) Bravais-Miller indices, where i=–(h+k), I is nonzero and at least one of h and k are non-zero. In a specific embodiment, the orientation of the large-area surfaces of the seed plates is within about 5 degrees, within about 2 degrees, within about 1 degree, within about 0.5 degree, within about 0.2 degree, or within about 0.1 degree of {1 –1 0 ±1}, {1 –1 0 ±2}, {1 –1 0 ±3}, {2 0 –2 ±1} or {1 1 –2 ±2}.

The one or more seed plates may be affixed to a seed rack, as described in U.S. Application Publication No. 2010/0031875, which is incorporated by reference in its entirety. If the front and back faces of the seed plates are crystallographically non-equivalent, as with a c-plane or semi-polar orientation, two seed plates may be placed back to back so that the outward facing surfaces have an equivalent crystallographic orientation.

A polycrystalline group III metal nitride or gallium nitride nutrient material may be provided, as described in U.S. Pat. No. 8,461,071 and U.S. Application Publication No. 2011/0220912. The polycrystalline group III metal nitride may have an oxygen content in the group III metal nitride material provided as a group III metal oxide or as a substitutional impurity within a group III metal nitride at a concentration between about 1 ppm and about 1000 ppm. In certain embodiments, the polycrystalline group III metal nitride comprises at least one of silicon and germanium at a concentration between about $1\times10^{16}$ $cm^{-3}$ and about $1\times10^{19}$ $cm^{-3}$ or between about $1\times10^{17}$ $cm^{-3}$ and about $3\times10^{18}$ $cm^{-3}$.

The polycrystalline group III metal nitride may be placed in a basket, which is then placed in an autoclave or a capsule, as described in U.S. Pat. Nos. 6,656,615; 7,125,453; and 7,078,731 and in U.S. Application Publication No. 2009/0301388. Ammonia and a mineralizer, for example, at least one of an alkali metal, amide, nitride, or azide, an alkaline earth metal, amide, nitride, or azide, ammonium fluoride, ammonium chloride, ammonium iodide, a group III metal fluoride, a group III metal chloride, a group III metal iodide, or a reaction product between a group III metal, ammonia, HF, HCl, and HI are also placed in the autoclave or capsule. In certain embodiments, the mineralizer comprises the condensable mineralizer composition HF, which is added to the autoclave or capsule by a method comprising: providing a manifold comprising at least one first transfer vessel, a source vessel containing a condensable mineralizer composition, and a receiving vessel; chilling the at least one first transfer vessel; transferring a quantity of the condensable mineralizer composition to the at least one first transfer vessel via a vapor phase and causing condensation of the condensable mineralizer composition within the at least one first transfer vessel; measuring the quantity of the condensable mineralizer composition within the at least one transfer vessel; and transferring the condensable mineralizer composition to the receiving vessel. Further details of the process for adding the condensable mineralizer composition to the autoclave or capsule are described in U.S. Pat. No. 9,299,555. Without wishing to be bound by theory, the inventors speculate that the higher purity levels enabled by the use of the anhydrous HF mineralizer may help enable the surprisingly low compensation ratios disclosed herein.

After all the raw materials have been added to the autoclave or capsule, the autoclave or capsule is sealed.

The capsule, if employed, is then placed within a suitable high pressure apparatus. In one embodiment, the high pressure apparatus comprises an autoclave, as described by U.S. Pat. No. 7,335,262. In another embodiment, the high pressure apparatus is an internally heated high pressure apparatus, as described in U.S. Pat. No. 7,125,453, and in U.S. Application Publication No. 2006/0177362 A1 and U.S. Pat. No. 8,097,081. The polycrystalline group III metal nitride and seed crystals are then processed in supercritical ammonia at a temperature greater than about 400 degrees Celsius and a pressure greater than about 50 MegaPascal (MPa), during which at least a portion of the polycrystalline group III metal nitride is etched away and recrystallized onto at least one group III nitride crystal with a wurtzite structure. In some embodiments, the polycrystalline group III metal nitride is processed in supercritical ammonia at a temperature greater than about 500 degrees Celsius, greater than about 550 degrees Celsius, greater than about 600 degrees Celsius, greater than about 650 degrees Celsius, greater than about 700 degrees Celsius, or greater than about 750 degrees Celsius. As discussed below, we have found evidence that the compensation ratio is reduced by choosing the growth temperature to be greater than about 600 degrees Celsius or greater than about 650 degrees Celsius. In some embodiments, the polycrystalline group III metal nitride is processed in supercritical ammonia at a pressure greater than about 50 MPa, greater than about 100 MPa, greater than about 200 MPa, greater than about 300 MPa, greater than about 400 MPa, greater than about 500 MPa, or greater than about 600 MPa.

By growing for a suitable period of time, the ammonothermally-grown crystalline group III metal nitride may have a thickness of greater than about 1 millimeter and a length, or diameter, greater than about 20 millimeters. In certain embodiments, the length is greater than about 50 millimeters or greater than about 100 millimeters. The crystalline group III nitride may be characterized by crystallographic radius of curvature of greater than 1 meter, greater than 10 meters, greater than 100 meters, greater than 1000 meter, or be greater than can be readily measured (infinite). After growth, the ammonothermally-grown crystalline group III metal nitride may be annealed in an inert, oxidizing, nitriding, or reducing atmosphere, for example, comprising one or more of argon, nitrogen, ammonia, oxygen, or hydrogen, at a pressure between about 1 millibar and 10,000 bar or between about 0.1 bar and about 1.1 bar. The annealing may be performed at a temperature between about 800 degree Celsius and about 1500 degree Celsius or between about 950 degrees Celsius and about 1200 degrees Celsius for a period of time in a range of from about 30 minutes to about 200 hours or from about 5 hours to about 50 hours. After growth, the ammonothermally-grown crystalline group III metal nitride may be sliced, lapped, polished, and chemical-mechanically polished according to methods that are known in the art to form one or more wafers or crystalline substrate members. In a specific embodiment, the root-mean-square surface roughness of the at least one wafer or crystalline substrate member is less than about one nanometer, for example, as measured by atomic force microscopy over an area of at least about 10 micrometers by 10 micrometers.

Figure 10:
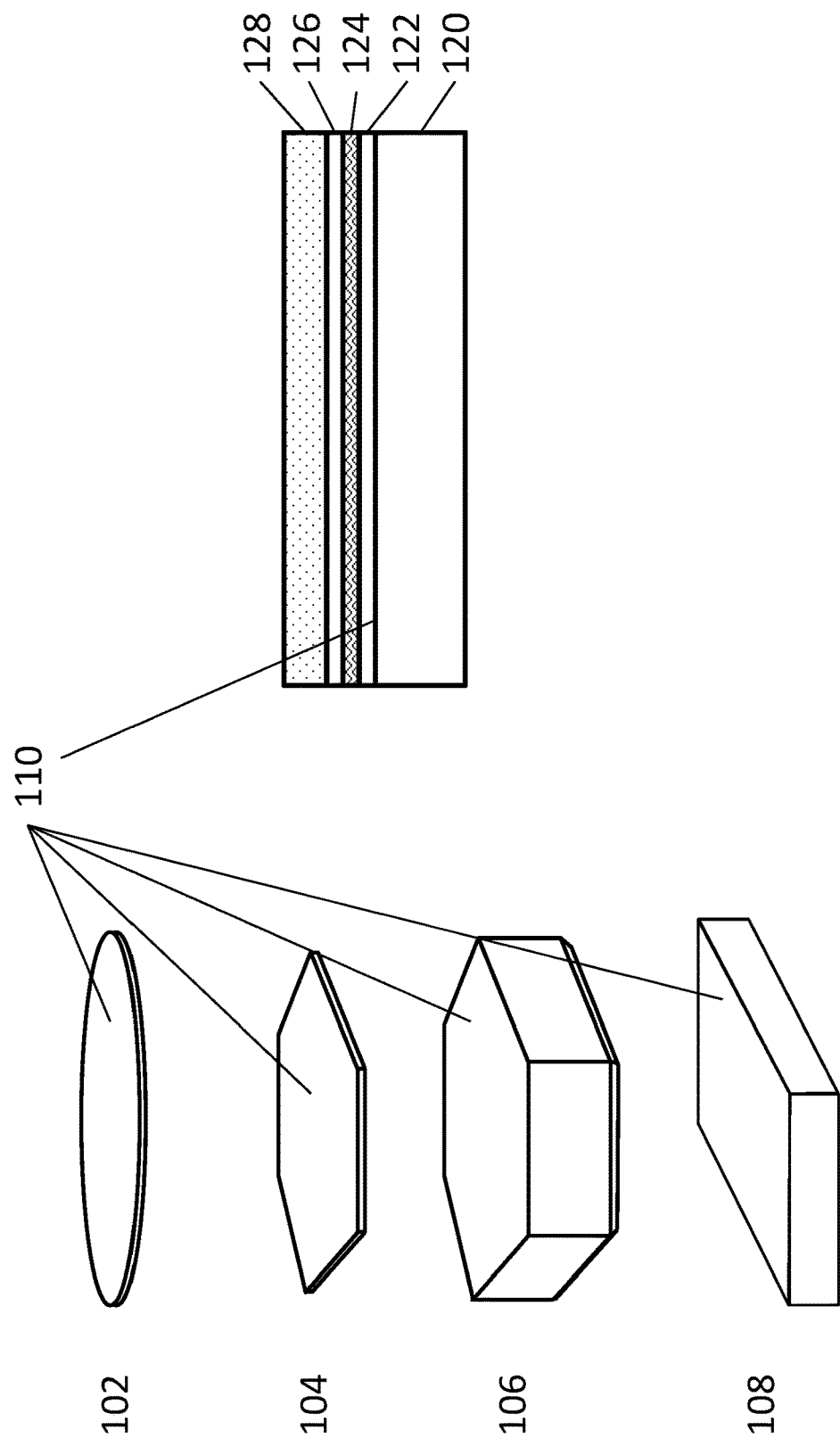
FIG. 10 shows crystal shapes and semiconductor devices fabricated on gallium-containing nitride crystals provided by the present disclosure according to certain embodiments.

Referring to FIG. 10, in certain embodiments the ammonothermally-grown crystalline group III metal nitride takes the form of a wafer 102, a platelet crystal 104, a hexagonal boule 106, or a rectangular boule 108. Other shapes are also possible, for example, comprising one or more of as-grown (0001), (000-1), {10-10}, {10-1-1}, {10-1-2}, {10-11}, and {10-12} surfaces. In each case one surface of the ammonothermally-grown crystalline group III metal nitride may be designated as a top surface 110. In certain embodiments the top surface comprises one of at most two largest-area surfaces of a free-standing ammonothermally-grown group III metal nitride crystal. In certain embodiments, top surface 110 has growth features such as hillocks and/or etch features such as pits. In certain embodiments, for example, a wafer 102, the top surface 110 has been prepared for epitaxial regrowth, for example, by metalorganic chemical vapor deposition (MOCVD), molecular beam epitaxy, hydride vapor phase epitaxy (HYPE), ammonothermal growth, or flux growth. In certain embodiments, top surface 110 is prepared by chemical mechanical polishing and final cleaning in a clean-room environment.

The ammonothermally-grown crystalline group III metal nitride may be characterized by a wurtzite structure substantially free from any cubic entities and have an optical absorption coefficient of about 2 $cm^{-1}$ and less at wavelengths between about 385 nanometers and about 750 nanometers. An ammonothermally-grown gallium nitride crystal may comprise a crystalline substrate member having a length greater than about 5 millimeters, have a wurtzite structure and be substantially free of other crystal structures, the other structures being less than about 0.1% in volume in reference to the substantially wurtzite structure, an impurity concentration greater than $10^{14}$ $cm^{-3}$, greater than $10^{15}$ $cm^{-3}$, or greater than $10^{16}$ $cm^{-3}$ of at least one of Li, Na, K, Rb, Cs, Mg, Ca, F, Cl, Br, and I and an optical absorption coefficient of about 2 $cm^{-1}$ and less at wavelengths between about 405 nanometers and about 750 nanometers. The ammonothermally-grown gallium nitride crystal may be an n-type semiconductor, with a carrier concentration n between about $3\times10^{17}$ $cm^{-3}$ and $10^{20}$ $cm^{-3}$ and a carrier mobility in units of centimeters squared per volt-second, such that the logarithm to the base 10 of the quantity $(1.2\times\eta)$ is greater than about $-0.4115[\log_{10}(n)]+10.028$. The optical absorption coefficient of the ammonothermally-grown crystalline group III metal nitride at wavelengths between about 395 nm and about 460 nm may be less than about 10 cm$^{-1}$, less than about 5 cm$^{-1}$, less than about 2 cm$^{-1}$, less than about 1 cm$^{-1}$, less than about 0.5 cm$^{-1}$, less than about 0.2 cm$^{-1}$, or less than about 0.1 cm$^{-1}$. The optical absorption coefficient of the ammonothermally-grown crystalline group III metal nitride at wavelengths of approximately 400 nm, 410 nm, 420 nm, and/or 450 nm may be less than about 10 cm$^{-1}$, less than about 5 cm$^{-1}$, less than about 2 cm$^{-1}$, less than about 1 cm$^{-1}$, less than about 0.5 cm$^{-1}$, less than about 0.2 cm$^{-1}$, or less than about 0.1 cm$^{-1}$. The ratio of the concentration of hydrogen to the concentration of oxygen in the ammonothermally-grown crystalline group III metal nitride, as measured by calibrated secondary ion mass spectrometry (SIMS), may be between about 0.5 and about 1.3.

The ammonothermally-grown crystalline group III metal nitride crystal, or a wafer sliced and polished from the crystal, may be used as a substrate for fabrication into optoelectronic and electronic devices such as at least one of a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, a solar cell, and a diode for photoelectrochemical water splitting and hydrogen generation.

Referring to FIG. 10, an ammonothermally-grown crystalline group III metal nitride crystal may be used as a substrate 120 for growth by MOCVD. An n-type layer 122, comprising n-type Al$_x$In$_y$Ga$_{1-x-y}$N, where 0≤x, y≤1, is deposited overlying top surface 110 of substrate 120, thereby transforming top surface 110 from a free surface to a regrowth interface. Active layer 124, which may comprise an AlInGaN multiple quantum well structure, for example, is then deposited overlying n-type layer 122, and p-type layer 126, comprising p-type Al$_u$In$_v$Ga$_{1-x-y}$N, where 0≤u, v≤1, is deposited overlying active layer 124. An electrical contact 128, which may be reflective, may be deposited overlying p-type layer 126. Other layers are also possible.

EXAMPLES

Embodiments provided by the present disclosure are further illustrated by reference to the following examples, which describe crystals, properties of the crystals, and methods of fabricating the crystals provided by the present disclosure. It will be apparent to those skilled in the art that many modifications, both to materials, and methods, may be practiced without departing from the scope of the disclosure.

In the examples described below, there are at least two sources of oxygen in the growth environment for gallium nitride crystals. The first source is oxygen present in polycrystalline gallium nitride that is used as nutrient for the crystal growth process. The second source may include residual moisture on surfaces of the raw materials, surface oxides, and the like. During the ammonothermal growth process, oxygen from the second source may dissolve quickly in the supercritical ammonia solvent, while oxygen from the first source is only released into the supercritical ammonia solvent as the polycrystalline gallium nitride is dissolved or etched during the crystal growth process. As a consequence, initial layers of gallium nitride material deposited on the seed crystals may contain an elevated concentration of oxygen. However, as growth proceeds and oxygen from the supercritical ammonia becomes incorporated into the growing gallium nitride crystals, oxygen from the second source becomes depleted while oxygen from the first source is continually replenished by further etching or dissolution of the polycrystalline gallium nitride nutrient material. Consequently, the concentration of oxygen in the gallium nitride crystals may decrease as a function of distance within the crystal from the initial seed surface. In the examples below, the oxygen concentration in gallium nitride wafers was varied both by changing the concentration of oxygen within the raw materials and by varying the distance of the wafer from the interface to the seed crystal.

Comparative Example 1

A first previously-ammonothermally-grown m-plane substrate, approximately 111 micrometers thick, was placed in a silver capsule along with a 13.4%-open-area baffle, polycrystalline GaN nutrient, NH$_4$F mineralizer, and ammonia, and the capsule was sealed. The ratios of GaN nutrient and NH$_4$F mineralizer to ammonia were approximately 1.85 and 0.091, respectively by weight. The capsule was placed in an internally-heated high pressure apparatus and heated to temperatures of approximately 655 degrees Celsius for the upper, nutrient zone and approximately 685 degrees Celsius for the lower, crystal growth zone, maintained at these temperatures for approximately 90 hours, and then cooled and removed. The first m-plane crystal grew to a thickness of approximately 685 micrometers.

Figure 2:
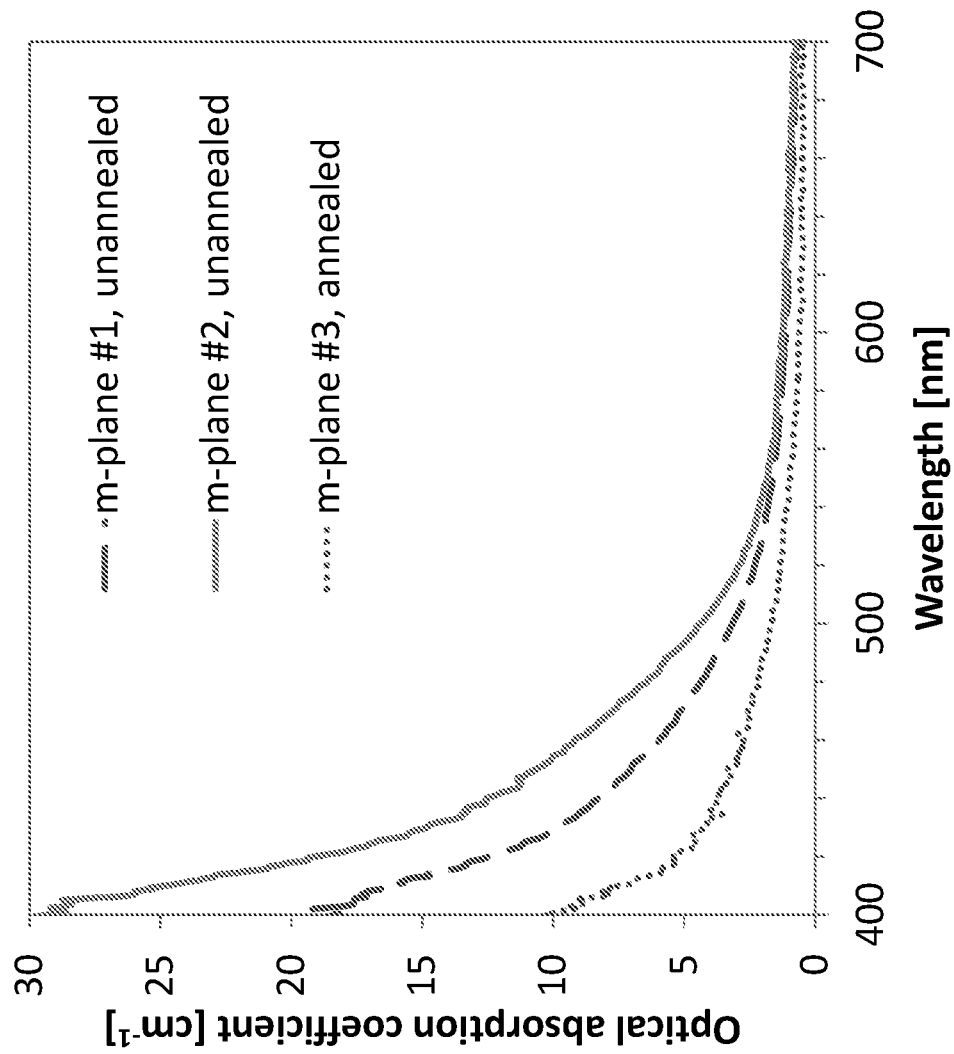
FIG. 2 shows optical absorption coefficients of several gallium-containing nitride crystals measured as a function of wavelength according to certain embodiments of the invention.

The front and back surface of the first m-plane ammonothermal crystal were polished and the optical absorption coefficient measured as a function of wavelength. The results are shown in FIG. 2. Although the crystal was transparent it had a strong yellow tint, with an optical absorption coefficient α of approximately 18 cm$^{-1}$ at a wavelength λ of 400 nm, approximately 16 cm$^{-1}$ at λ=410 nm, approximately 14 cm$^{-1}$ at λ=415 nm, and approximately 7 cm$^{-1}$ at λ=450 nm, with a wavelength derivative d α/dλ of approximately −0.36 cm$^{-1}$/nm at λ=410 nm. The infrared spectrum of the m-plane ammonothermal crystal was measured using a commercial Fourier Transform infrared spectrometer. Referring to Table 1, peaks $b_1$, $b_2$, $b_3$, $b_4$, $c_1$, $c_2$, and $c_3$ were present, similar to those in the prior-art crystal. However, peaks $a_1$ and $a_2$, which were quite prominent in the prior-art crystal, were not visible at all in the first m-plane ammonothermal crystal, proving that different species are responsible for peaks $a_1$ and $a_2$ than for peaks $b_1$, $b_2$, and $b_4$, contradicting the peak assignments in the prior-art reference. In addition, a new peak, $c_4$, was visible in the spectrum of the first m-plane ammonothermal crystal. The surface impurity composition of this crystal was measured by calibrated secondary ion mass spectrometry (SIMS) yielding levels of 4.2×10$^{19}$ cm$^{-3}$ for hydrogen, 1.6×10$^{19}$ cm$^{-3}$ for oxygen, and 8.6×10$^{18}$ cm$^{-3}$ for fluorine.

Example 1

A first c-plane bulk GaN seed crystal grown ammonothermally, approximately 262 micrometers thick, was placed in a silver capsule along with a 13%-open-area baffle, polycrystalline GaN nutrient, HF mineralizer, and ammonia, and the capsule was sealed. The ratios of GaN nutrient and HF mineralizer to ammonia were approximately 3.67 and 0.051, respectively, by weight, and the nutrients had an oxygen concentration of approximately 5 parts per million. The capsule was placed in an internally-heated high pressure apparatus and heated to temperatures of approximately 662 degrees Celsius for the upper, nutrient zone and approximately 676 degrees Celsius for the lower, crystal growth zone, maintained at these temperatures for approximately 230 hours, and then cooled and removed. An ammonothermal GaN layer approximately 1858 micrometers thick grew on the seed crystal with a smooth top surface. Two wafers, designated as S1 and S2, respectively, were formed from the ammonothermal GaN layer at different distances from the regrowth interface, having dimensions of approximately 10×10×0.28 mm$^3$, with both front and back surfaces polished and chemical-mechanically polished. The concentrations of oxygen and hydrogen in S1 were measured as approximately $1.6 \times 10^{18}$ cm$^{-3}$ and $1.4 \times 10^{18}$ cm$^{-3}$, respectively, by calibrated secondary ion mass spectrometry (SIMS). The concentrations of oxygen and hydrogen in S2 were measured as approximately $2.1 \times 10^{18}$ cm$^{-3}$ and $1.2 \times 10^{18}$ cm$^{-3}$, respectively. Electrical contacts were placed on the wafers and Hall Effect electrical properties were measured in the van der Pauw geometry at room temperature using a Nanometric HL 5580 instrument. The Hall carrier (electron) concentrations and Hall carrier (electron) mobilities are summarized in Table 2. The optical absorption coefficient of the wafer was measured as a function of wavelength using an Ocean Optics HPX 2000 high powered xenon lamp as the light source, an Ocean Optics 2000+ spectrometer and CCD detector, and a 6-inch diameter integrating sphere. The optical absorption coefficients at a wavelength of 410 nm are summarized in Table 2. Fourier-transform infrared (FTIR) spectra of the wafers was measured using a Nicolet *Magna* 850 FTIR spectrometer with a KBr beam splitter and a deuterated triglycine sulfate (DTGS) detector at 1 cm$^{-1}$ spectral resolution. Cathodoluminescence (CL) spectra were measured on the wafers using an FEI Inspect scanning electron microscope with an Oxford CL2attachment, which includes a photomultiplier tube and a monochrometer with a grating size of 1200 grooves/mm. CL scans were performed at room temperature from 350 nm to 900 nm with a 0.5 nm step size using a 20 keV acceleration voltage and a scan area of 128×128 micrometers square.

in a silver capsule along with a 13%-open-area baffle, polycrystalline GaN nutrient, HF mineralizer, and ammonia, and the capsule was sealed. The ratios of GaN nutrient and HF mineralizer to ammonia were approximately 3.42 and 0.051, respectively, by weight, and the nutrients had an oxygen concentration of approximately 8 parts per million. The capsule was placed in an internally-heated high pressure apparatus and heated to temperatures of approximately 662 degrees Celsius for the upper, nutrient zone and approximately 676 degrees Celsius for the lower, crystal growth zone, maintained at these temperatures for approximately 230 hours, and then cooled and removed. An ammonothermal GaN layer approximately 1128 micrometers thick grew on the seed crystal with a smooth top surface. Two wafers, designated as S3 and S4, respectively, were formed from the ammonothermal GaN layer at different distances from the regrowth interface, having dimensions of approximately 10×10×0.28 mm$^3$, with both front and back surfaces polished and chemical-mechanically polished. The wafers were characterized as in Example 1 and the results are summarized in Table 2.

Example 3

A third c-plane bulk GaN seed crystal grown ammonothermally, approximately 244 micrometers thick, was placed in a silver capsule along with a 13%-open-area baffle, polycrystalline GaN nutrient, HF mineralizer, and ammonia, and the capsule was sealed. The ratios of GaN nutrient and HF mineralizer to ammonia were approximately 3.74 and 0.053, respectively, by weight, and the nutrients had an oxygen concentration of approximately 30 parts per million. The capsule was placed in an internally-heated high pressure apparatus and heated to temperatures of approximately 662 degrees Celsius for the upper, nutrient zone and approximately 677 degrees Celsius for the lower, crystal growth zone, maintained at these temperatures for approximately 230 hours, and then cooled and removed. An ammonothermal GaN layer approximately 1513 micrometers thick grew on the seed crystal with a smooth top surface. A wafer, designated as S5, was formed from the ammonothermal GaN layer, having dimensions of approximately 10×10×

TABLE 2

Summary of growth conditions for n-type, oxygen-doped ammonothermal GaN crystals and properties of wafers derived therefrom.

| Sample | GaN/NH$_3$ | HF/NH$_3$ | T$_{nutrient}$ | T$_{growth}$ | Growth Time (hr) | [O] | [H] | [n] | η | α(410 nm) | Compensation ratio | [H]/[O] |
|---|---|---|---|---|---|---|---|---|---|---|---|---|
| S1 | 3.67 | 0.051 | 661.7 | 675.9 | 230 | 1.6E+18 | 1.4E+18 | 6.5E+17 | 491 | 1.61 | 2.37 | 0.92 |
| S2 | 3.67 | 0.051 | 661.7 | 675.9 | 230 | 2.1E+18 | 1.2E+18 | 1.0E+18 | 425 | 1.95 | 2.05 | 0.57 |
| S3 | 3.42 | 0.051 | 662.5 | 676.2 | 230 | 2.6E+18 | 3.3E+18 | 1.4E+18 | 350 | 3.72 | 1.87 | 1.25 |
| S4 | 3.42 | 0.051 | 662.5 | 676.2 | 230 | 5.1E+18 | 5.2E+18 | 2.2E+18 | 285 | 4.64 | 2.30 | 1.02 |
| S5 | 3.74 | 0.053 | 662.3 | 677.0 | 230 | 9.7E+18 | 9.1E+18 | 4.3E+18 | 249 | 7.4 | 2.26 | 0.94 |
| S6 | 3.97 | 0.053 | 665.8 | 677.8 | 234 | 3.1E+18 | 2.3E+18 | 1.0E+18 | 422 | 2.7 | 3.11 | 0.73 |
| S7 | 3.81 | 0.055 | 666.8 | 678.1 | 284 | 4.5E+18 | 2.0E+18 | 1.5E+18 | 360 | 2.9 | 3.00 | 0.44 |
| S8 | 3.70 | 0.051 | 666.0 | 677.9 | 417 | 2.7E+19 | 2.0E+19 | 1.5E+19 | 156 | 32.6 | 1.88 | 0.72 |
| S9 | 3.48 | 0.054 | 666.1 | 677.9 | 341 | 1.6E+18 | 1.2E+18 | 6.2E+17 | 567 |  | 2.61 | 0.76 |
| S10 | 3.73 | 0.051 | 661.7 | 677.2 | 170 | 3.1E+18 | 2.2E+18 | 1.5E+18 | 336 |  | 2.09 | 0.73 |
| S11 | 3.62 | 0.050 | 619.7 | 628.4 | 207 | 2.0E+19 | 1.2E+19 | 5.7E+18 | 172 |  | 3.54 | 0.58. |

The units for [O], [H], and [n] are cm$^{-3}$. The units for η and α are cm$^2$/V-sec and cm$^{-1}$, respectively.

Example 2

A second c-plane bulk GaN seed crystal grown ammonothermally, approximately 263 micrometers thick, was placed 0.28 mm$^3$, with both front and back surfaces polished and chemical-mechanically polished. The wafer was characterized as in Example 1 and the results are summarized in Table 1.

Example 4

A fourth c-plane bulk GaN seed crystal grown ammonothermally, approximately 245 micrometers thick, was placed in a silver capsule along with a 10%-open-area baffle, polycrystalline GaN nutrient, HF mineralizer, and ammonia, and the capsule was sealed. The ratios of GaN nutrient and HF mineralizer to ammonia were approximately 3.97 and 0.053, respectively, by weight, and the nutrients had an oxygen concentration of approximately 10 parts per million. The capsule was placed in an internally-heated high pressure apparatus and heated to temperatures of approximately 666 degrees Celsius for the upper, nutrient zone and approximately 678 degrees Celsius for the lower, crystal growth zone, maintained at these temperatures for approximately 234 hours, and then cooled and removed. An ammonothermal GaN layer approximately 1150 micrometers thick grew on the seed crystal with a smooth top surface. A wafer, designated as S6, was formed from the ammonothermal GaN layer, having dimensions of approximately 10×10×0.52 mm$^3$, with both front and back surfaces polished and chemical-mechanically polished. The wafer was characterized as in Example 1 and the results are summarized in Table 1.

Example 5

A fifth c-plane bulk GaN seed crystal grown ammonothermally, approximately 255 micrometers thick, was placed in a silver capsule along with a 10%-open-area baffle, polycrystalline GaN nutrient, HF mineralizer, and ammonia, and the capsule was sealed. The ratios of GaN nutrient and HF mineralizer to ammonia were approximately 3.81 and 0.055, respectively, by weight, and the nutrients had an oxygen concentration of approximately 15 parts per million. The capsule was placed in an internally-heated high pressure apparatus and heated to temperatures of approximately 667 degrees Celsius for the upper, nutrient zone and approximately 678 degrees Celsius for the lower, crystal growth zone, maintained at these temperatures for approximately 284 hours, and then cooled and removed. An ammonothermal GaN layer approximately 1200 micrometers thick grew on the seed crystal with a smooth top surface. A wafer, designated as S7, was formed from the ammonothermal GaN layer, having dimensions of approximately 10×10×0.53 mm$^3$, with both front and back surfaces polished and chemical-mechanically polished. The wafer was characterized as in Example 1 and the results are summarized in Table 1.

Example 6

A sixth c-plane bulk GaN seed crystal grown ammonothermally, approximately 737 micrometers thick, was placed in a silver capsule along with a 10%-open-area baffle, polycrystalline GaN nutrient, HF mineralizer, and ammonia, and the capsule was sealed. The ratios of GaN nutrient and HF mineralizer to ammonia were approximately 3.70 and 0.051, respectively, by weight, and the nutrients had an oxygen concentration of approximately 100 parts per million. The capsule was placed in an internally-heated high pressure apparatus and heated to temperatures of approximately 666 degrees Celsius for the upper, nutrient zone and approximately 678 degrees Celsius for the lower, crystal growth zone, maintained at these temperatures for approximately 417 hours, and then cooled and removed. An ammonothermal GaN layer approximately 1100 micrometers thick grew on the seed crystal with a smooth top surface. A wafer, designated as S8, was formed from the ammonothermal GaN layer, having dimensions of approximately 10×10×0.13 mm$^3$, with both front and back surfaces polished and chemical-mechanically polished. The wafer was characterized as in Example 1 and the results are summarized in Table 1.

Example 7

A seventh c-plane bulk GaN seed crystal grown ammonothermally, approximately 297 micrometers thick, was placed in a silver capsule along with a 10%-open-area baffle, polycrystalline GaN nutrient, HF mineralizer, and ammonia, and the capsule was sealed. The ratios of GaN nutrient and HF mineralizer to ammonia were approximately 3.48 and 0.054, respectively, by weight, and the nutrients had an oxygen concentration of approximately 5 parts per million. The capsule was placed in an internally-heated high pressure apparatus and heated to temperatures of approximately 666 degrees Celsius for the upper, nutrient zone and approximately 678 degrees Celsius for the lower, crystal growth zone, maintained at these temperatures for approximately 341 hours, and then cooled and removed. An ammonothermal GaN layer approximately 1132 micrometers thick grew on the seed crystal with a smooth top surface. A wafer, designated as S9, was formed from the ammonothermal GaN layer, having dimensions of approximately 10×10×0.22 mm$^3$, with both front and back surfaces polished and chemical-mechanically polished. The wafer was characterized as in Example 1 and the results are summarized in Table 1.

Example 8

An eighth c-plane bulk GaN seed crystal grown ammonothermally, approximately 269 micrometers thick, was placed in a silver capsule along with a 13%-open-area baffle, polycrystalline GaN nutrient, HF mineralizer, and ammonia, and the capsule was sealed. The ratios of GaN nutrient and HF mineralizer to ammonia were approximately 3.73 and 0.051, respectively, by weight, and the nutrients had an oxygen concentration of approximately 10 parts per million. The capsule was placed in an internally-heated high pressure apparatus and heated to temperatures of approximately 666 degrees Celsius for the upper, nutrient zone and approximately 677 degrees Celsius for the lower, crystal growth zone, maintained at these temperatures for approximately 170 hours, and then cooled and removed. An ammonothermal GaN layer approximately 1091 micrometers thick grew on the seed crystal with a smooth top surface. A wafer, designated as S10, was formed from the ammonothermal GaN layer, having dimensions of approximately 10×10×0.15 mm$^3$, with both front and back surfaces polished and chemical-mechanically polished. The wafer was characterized as in Example 1 and the results are summarized in Table 1.

Example 9

A seventh c-plane bulk GaN seed crystal grown ammonothermally, approximately 320 micrometers thick, was placed in a silver capsule along with a 10%-open-area baffle, polycrystalline GaN nutrient, HF mineralizer, and ammonia, and the capsule was sealed. The ratios of GaN nutrient and HF mineralizer to ammonia were approximately 3.62 and 0.050, respectively, by weight, and the nutrients had an oxygen concentration of approximately 75 parts per million. The capsule was placed in an internally-heated high pressure apparatus and heated to temperatures of approximately 620 degrees Celsius for the upper, nutrient zone and approximately 628 degrees Celsius for the lower, crystal growth zone, maintained at these temperatures for approximately 207 hours, and then cooled and removed. An ammonothermal GaN layer approximately 1054 micrometers thick grew on the seed crystal with a smooth top surface. A wafer, designated as S11, was formed from the ammonothermal GaN layer, having dimensions of approximately 10×10× 0.40 mm$^3$, with both front and back surfaces polished and chemical-mechanically polished. The wafer was characterized as in Example 1 and the results are summarized in Table 1.

Figure 3:
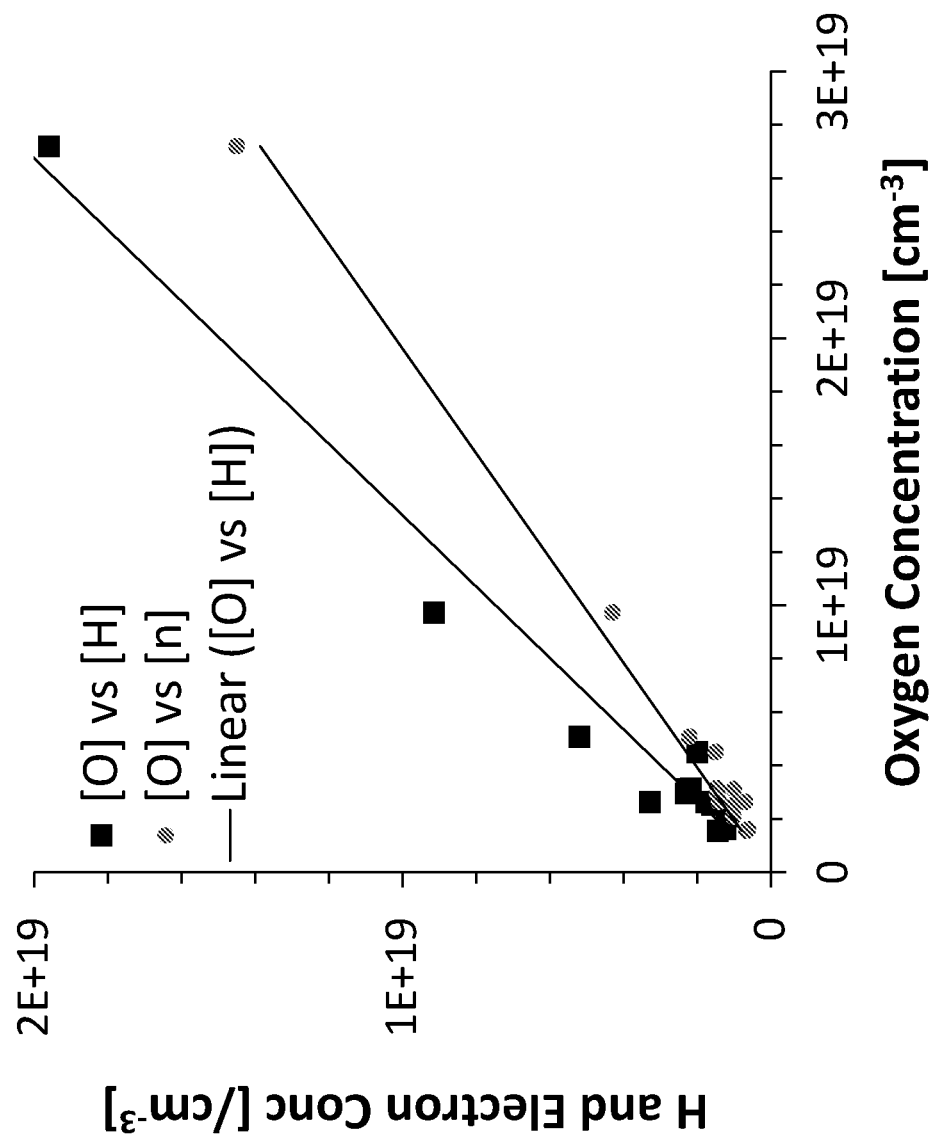
FIG. 3 shows hydrogen and carrier (electron) concentrations as a function of oxygen concentration in eleven ammonothermally-grown GaN crystals according to certain embodiments of the invention.

FIG. 3 shows the measured concentrations of hydrogen and of electrons (carriers) as a function of the measured oxygen concentration in the eleven wafers. The slope of the [n] vs [O] plot is measured as 0.51, indicating that only 51% of the oxygen is activated for a doping range between $6.5 \times 10^{17}$ to $1.5 \times 10^{19}$ cm$^3$, and corresponding to an average compensation ratio of 1.96. From the results summarized in Table 1, the compensation ratio in samples S1 through S11 ranged from a minimum value of 1.87 to a maximum value of 3.54, and the latter value corresponded to a crystal (S11) grown at a significantly lower temperature than the other samples.

To explore the source of compensation, that is, a compensation ratio above 1.0, an extensive survey of possible impurities in these ammonothermal GaN wafers by SIMS was performed, looking for elements such as Si, Ge, Fe, Co, Cu, Mo, Mg, Ca, Cr, Mn, Ni, Co, W, Zn, In, Al, K, Na, Li, P, F, Cl, C, S and H. Hydrogen was found to be the only other impurity present in the same order of magnitude in concentration as oxygen. As FIG. 3 and Table 1 also shows, a strong positive correlation also exists between [O] and [H]. In particular, the average [H]/[O] ratio was 0.75 and the ratio for the individual wafers varied between 0.58 and 1.25, and the former value was obtained for a crystal (S11) grown at a significantly lower temperature than the other samples. Either interstitial hydrogen or hydrogen on a nitrogen site would act as a donor and would therefore not act as a source of compensation [J. Neugebauer and C. G. Van De Walle, Phys. Rev. B 1829, 10 (2012)]. However, as described above, $V_{Ga}$—H, $V_{Ga}$—H$_2$, $V_{Ga}$—O—H complexes constitute well-known deep level acceptor-type defects in n-type GaN that can compensate electrons from a donor such as oxygen. The $V_{Ga}$—O-2H complex, while not electrically active, similarly results in oxygen incorporation without contributing an electron to the conduction band. Increasing the oxygen doping concentration raises the Fermi level of the crystal which lowers the formation energy of many of the negatively-charged gallium vacancy complexes ($V_{Ga}$—H$^{2-}$, $V_{Ga}$-2H$^-$, $V_{Ga}$—O—H$^-$) and thereby likely increases their concentrations. The formation energies of $V_{Ga}$-3H and $V_{Ga}$—O-2H are independent of the Fermi level in n-type GaN as they are neutral. The concentration of $V_{Ga}$-3H is therefore independent of the oxygen concentration but the concentration of $V_{Ga}$—O-2H likely increases with oxygen concentration since an oxygen atom is present in it. Without wishing to be bound by theory, the close correlation between [H] and [O] in FIG. 3 suggests that the majority of vacancy defects consist of $V_{Ga}$-1H and $V_{Ga}$-2H, $V_{Ga}$—O—H, and $V_{Ga}$—O-2H.

Figure 4:
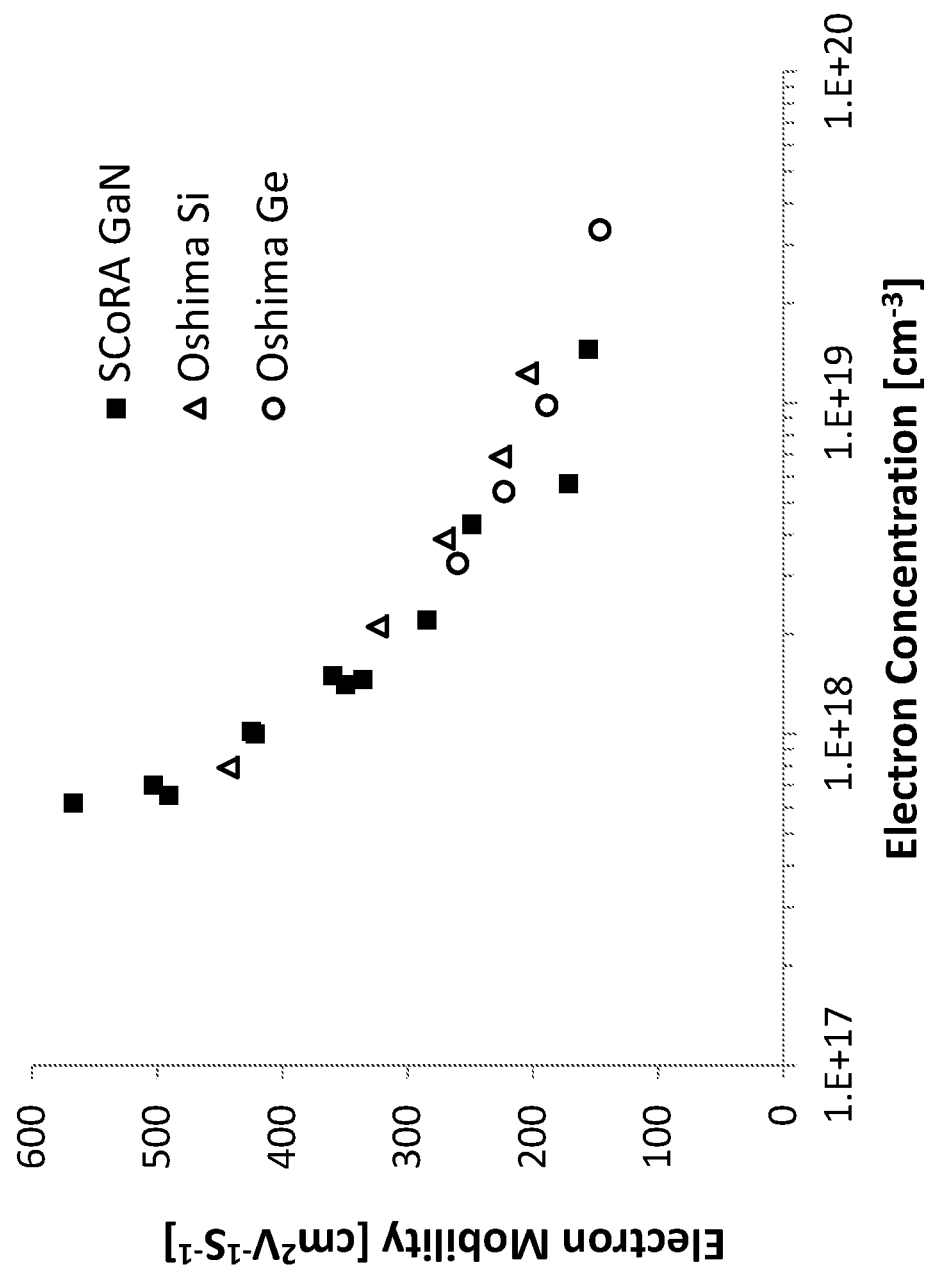
FIG. 4 shows the carrier (electron) mobility as a function of carrier (electron) concentration for eleven ammonothermally-grown GaN crystals according to certain embodiments of the invention together with values for Ge— and Si-doped GaN crystals grown by HVPE according to the prior art.

FIG. 4 shows the measured Hall mobility η in the eleven ammonothermal GaN wafers as a function of electron concentration and compares these results to similar data from Si-doped and Ge-doped bulk GaN wafers fabricated by the HVPE method [Y. Oshima et al., Physica Status Solidi C 4, 2215 (2007); Y. Oshima et al., Journal of Crystal Growth 312, 3569 (2010)]. The data for the ammonothermal crystals may be well fit by the empirical function $$\log_{10}(\eta) = -0.4115 [\log_{10}(n)] + 10.028.$$

It is apparent that although the ammonothermal GaN wafers contain a significant concentration of gallium vacancy defects, and the compensation ratio is approximately 2 rather than approximately 1, the expected values for the HVPE samples, there is no significant decrease in the measured carrier mobilities, which is very important for device applications. The much lower carrier mobility values reported by Pimputkar et al. for ammonothermal GaN may indicate the presence of other defects that are less benign than the defects observed under these specialized process conditions.

Figure 5:
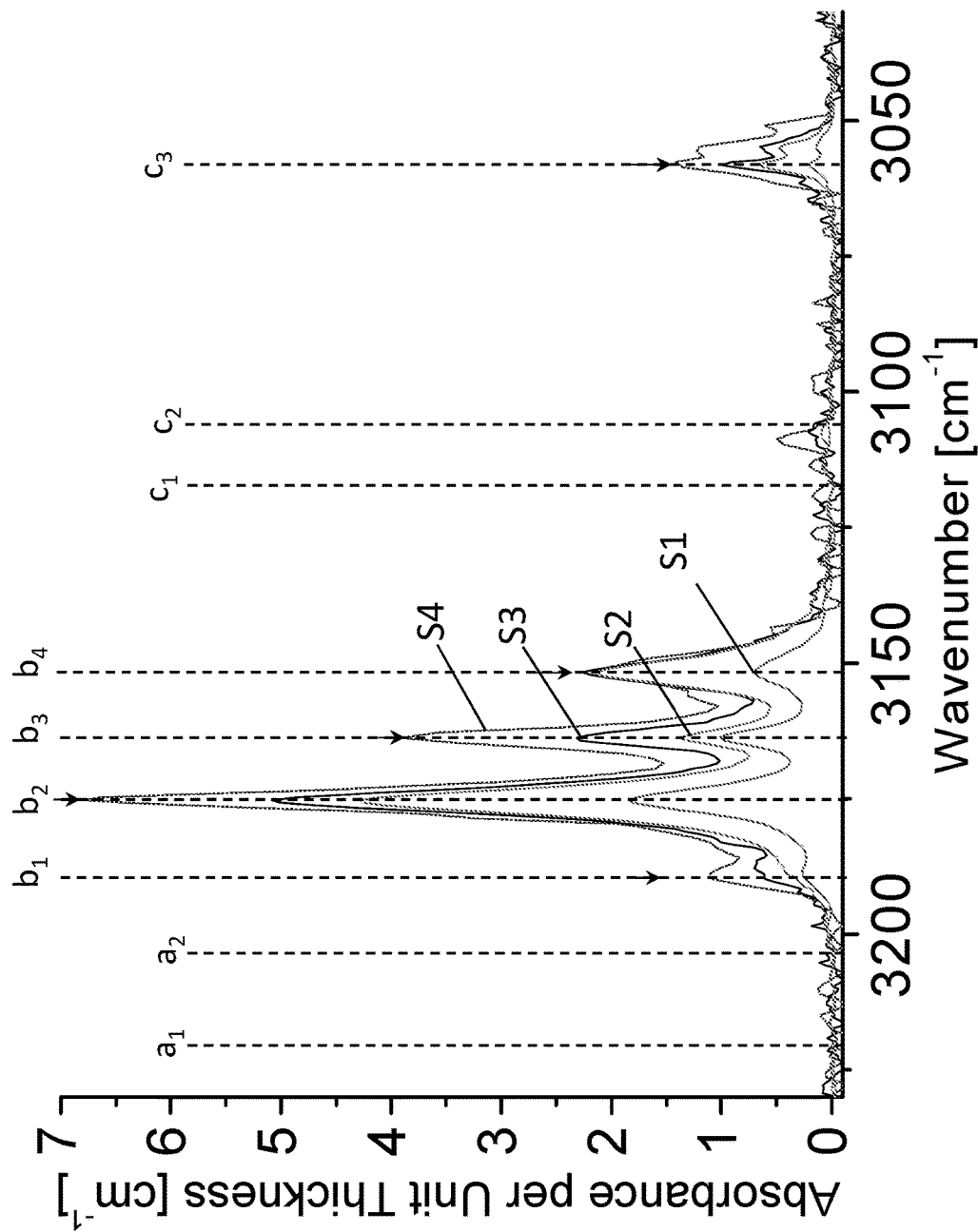
FIG. 5 shows measured infrared spectra of four gallium-containing nitride crystals according to certain embodiments of the invention.

The stretching modes of N—H bonds in hydrogenated Ga-vacancies are reported to have IR absorption in the 3000 to 3500 cm$^{-1}$ wavenumber range, as noted above. Fourier transform infrared absorption spectroscopy (FTIR) was performed on the five ammonothermal samples S1 to S5. Owing to the large background free carrier absorption, we were not able to resolve a clear signal for sample S5. The IR absorption coefficients (absorbance divided by sample thickness) for samples S1 to S4 are shown in FIG. 5. The free carrier absorption baseline has been subtracted from each spectrum. The detected peaks match well with previous reports. However, we see that, in contrast to previous reports, peaks $a_1$, $a_2$, and $c_1$ were not observed, and peak $c_2$ is very weak. Specifically, each of samples S1 through S4 have an absorbance per unit thickness of at least 0.01 cm$^{-1}$ at wavenumbers of approximately 3175 cm$^{-1}$, 3164 cm$^{-1}$, and 3150 cm$^{-1}$ and no infrared absorption peaks at wavenumbers between about 3200 cm$^{-1}$ and about 3400 cm$^{-1}$ or between about 3075 cm$^{-1}$ and about 3125 cm$^{-1}$ having an absorbance per unit thickness greater than 10% of the absorbance per unit thickness at 3175 cm$^{-1}$, despite a wide range of dopant concentrations. To re-state, surprisingly, samples S1, S2, S3, and S4 only exhibited peaks $b_1$, $b_2$, $b_3$, and $b_4$, but not $a_1$ or $a_2$. The ratios of the peak intensities of the $b_3$ and $b_4$ peaks to that of the $b_2$ peak were between 10% and 90% or between 15% and 85%. The $b_1$ and $c_3$ peaks were also visible in the spectra, with peak amplitudes between 5% and 25% of that of the $b_2$ peak. The $a_1$, $a_2$, $c_1$, and $c_2$, peaks were either not visible at all or at most marginally visible, with a peak intensity less than 10% or less than 5% than that of the $b_2$ peak.

While most of the peaks in FIG. 5 correlate positively with oxygen doping concentration, peak $b_4$ situated at 3150 cm$^{-1}$ does not. The peak $b_4$ intensity is almost the same for sample S2, S3 and S4 even though their oxygen concentrations are very different. A commercially available HVPE sample with a free carrier concentration of $1 \times 10^{18}$ cm$^{-3}$ was also measured by FTIR and no absorption peaks were found in the 400 to 4000 cm$^{-1}$ wavenumber range, indicating that hydrogenated Ga-vacancy are not present in large quantities in HVPE GaN.

Figure 6:
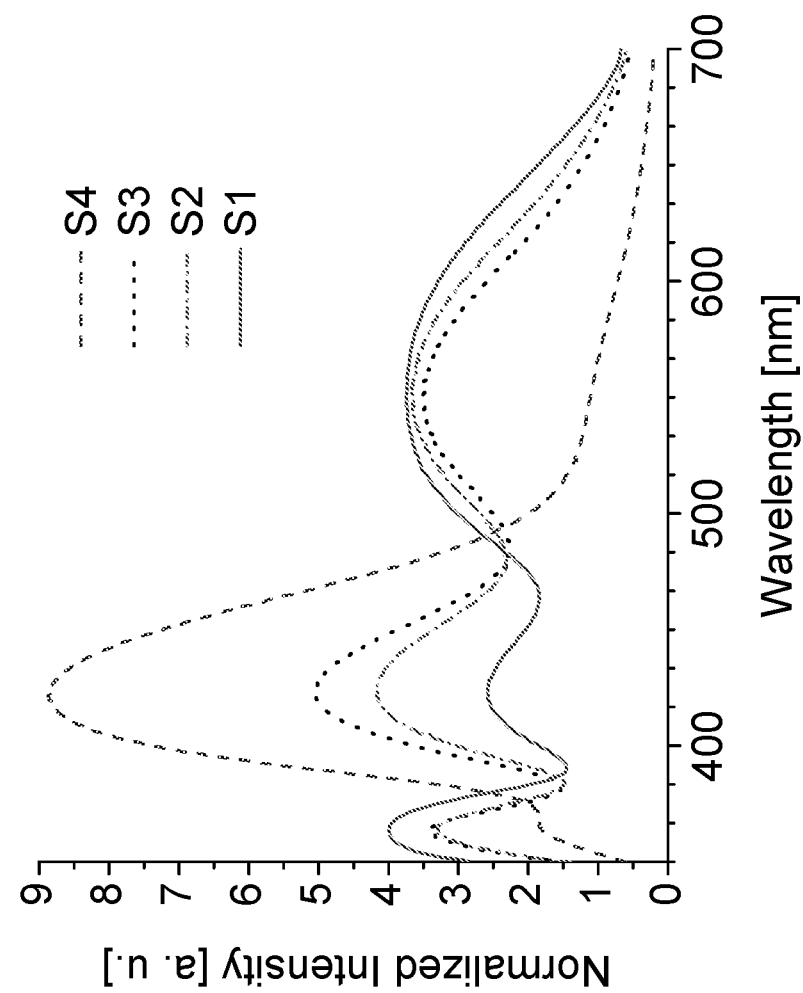
FIG. 6 shows measured cathodoluminescence spectra of four gallium-containing nitride crystals according to certain embodiments of the invention.

FIG. 6 shows the room temperature CL spectra for samples S1 to S4 with the intensities normalized by the total integrated intensity of the entire spectrum. A broad peak at ~423 nm (or 0.5 eV above valence band) shows a strong positive correlation with oxygen doping. As the 423 nm peak increases in intensity, the band edge peak and the well-known yellow luminescence peak at about.560 nm become suppressed. For each CL spectrum in FIG. 6, the intensity is normalized by dividing each individual data point by the total integrated CL intensity between 350 to 900 nm for the spectrum and then multiplied by 1000.

Figure 7:
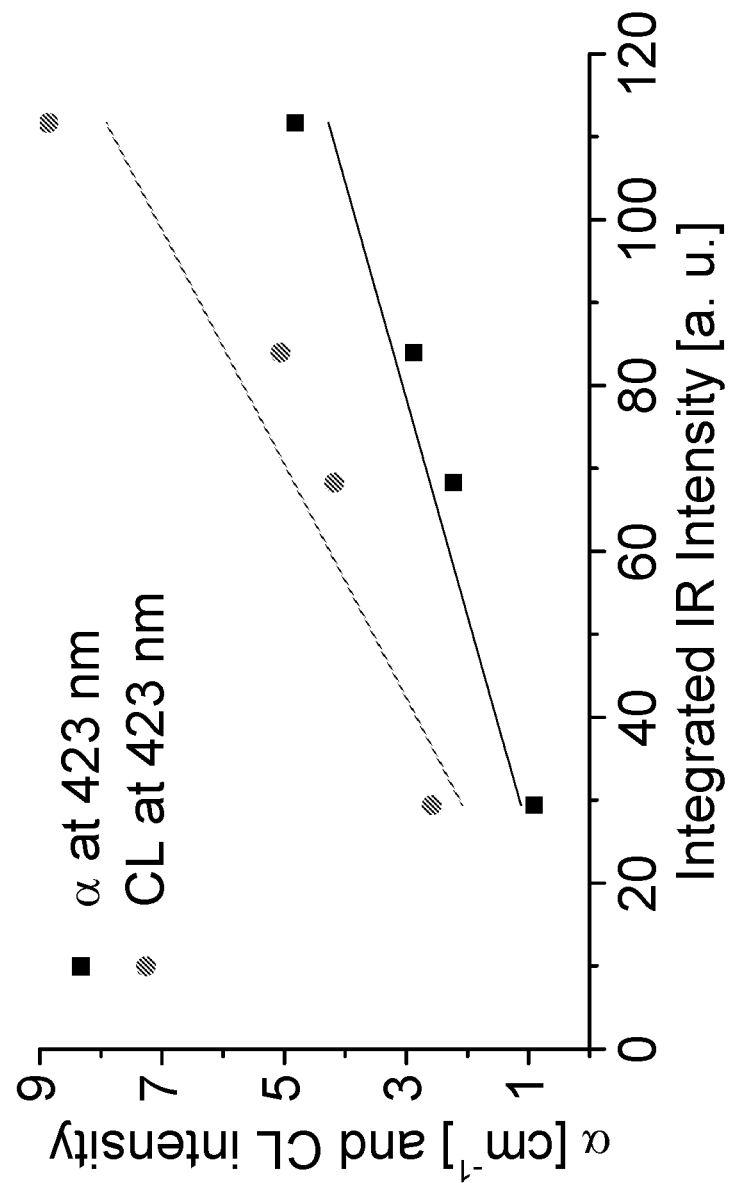
FIG. 7 shows measured values of the optical absorption coefficient and the cathodoluminescence peak intensity at a wavelength of 423 nm of four gallium-containing nitride crystals according to certain embodiments of the invention.
Figure 8:
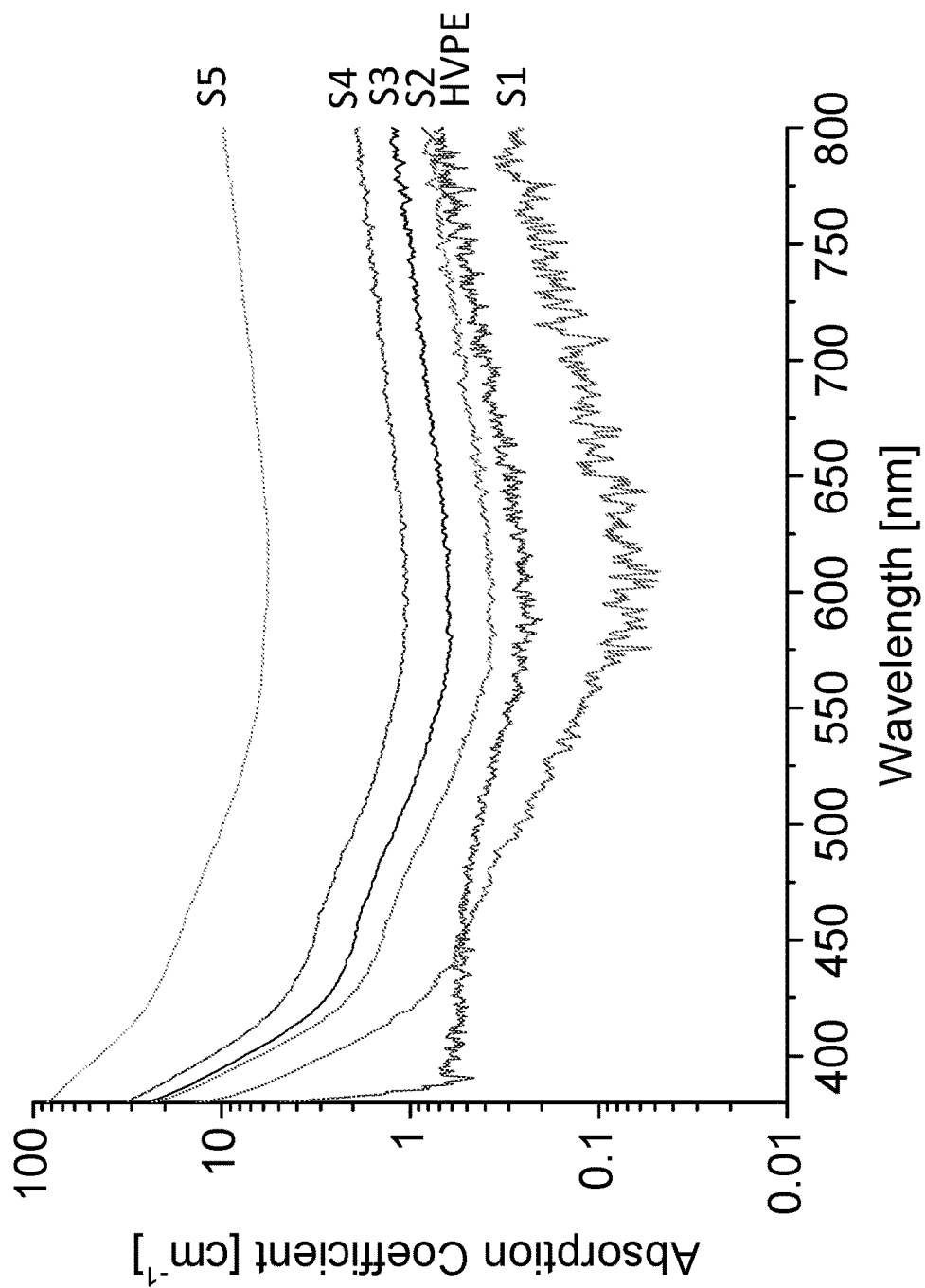
FIG. 8 shows optical absorption coefficients of five ammonothermally-grown gallium-containing nitride crystals, measured as a function of wavelength, according to certain embodiments of the invention, together with values for an HVPE GaN crystal grown according to the prior art.
Figure 9:
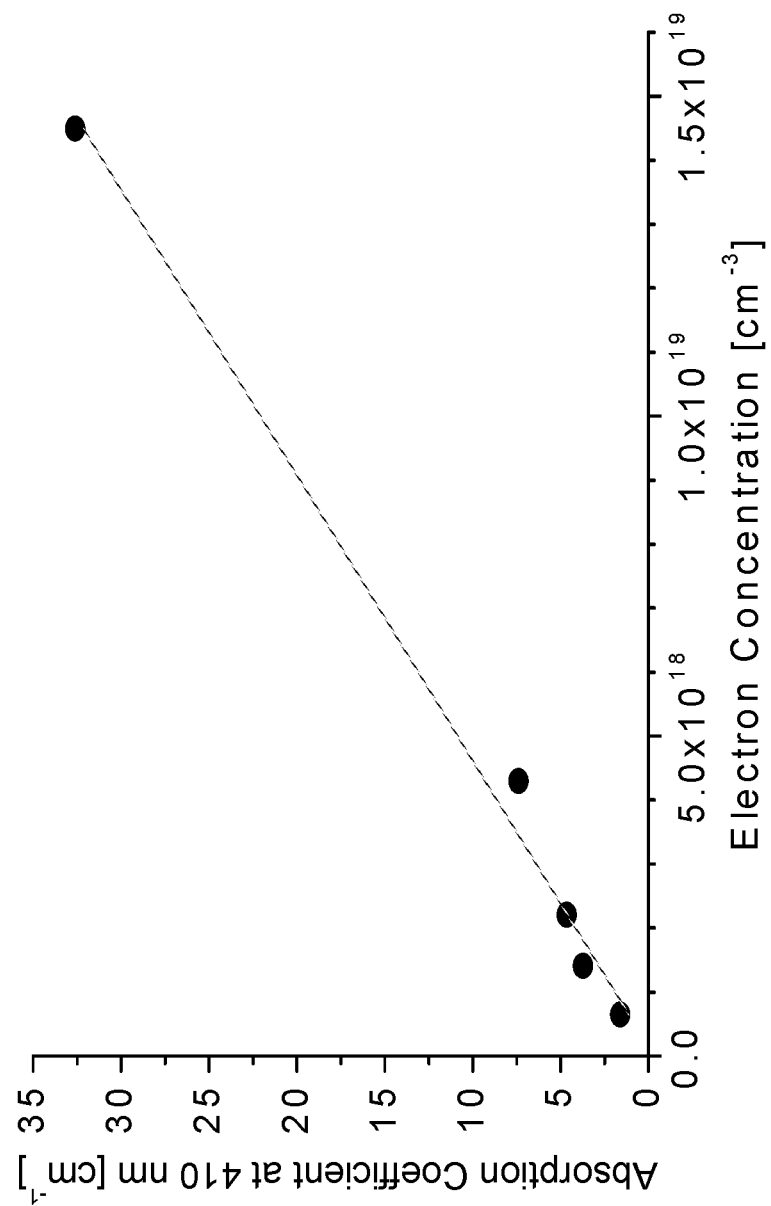
FIG. 9 shows the optical absorption coefficient at a wavelength of 410 nanometers of five gallium-containing nitride crystals measured as a function of electron concentration according to certain embodiments of the invention.

FIG. 7 shows the correlation between the total integrated FTIR intensity, integrated between 3000 cm$^{-1}$ and 3250 cm$^{-1}$, vs the CL peak intensity, as well as the optical absorption coefficient at 423 nm. Full optical absorption spectra between 400 to 900 nm are shown in FIG. 8 for samples S1 to S4. Both data sets in FIG. 7 show a very good linear fit, suggesting that hydrogenated and/or hydrogenated-oxygenated Ga-vacancies, as characterized by their infrared absorption spectra, are also the source of luminescence and optical absorption at 423 nm.

Table 3 shows a summary of the CL intensities shown in FIG. 6 at wavelengths of 365, 423, and 550 nm, the optical absorption coefficient α at 423 nm, and the integrated FTIR intensities for samples S1, S2, S3, and S4, along with ratios of these quantities. It is seen that, surprisingly, the ratio of the CL intensity, normalized as described above, to the integrated FTIR intensity, is between 0.05 and 0.10, or between 0.06 and 0.09, for each of these samples, despite the wide range of oxygen concentrations. Similarly, surprisingly, the ratio of the optical absorption coefficient α at 423 nm to the integrated FTIR intensity, is between 0.02 and 0.05, or between 0.03 and 0.045, for each of these samples, despite the wide range of oxygen concentrations.

TABLE 3

Summary of optical measurements of samples S1 to S4.

|    | CL Intensity @365 ± 5 nm | CL Intensity @423 ± 5 nm | CL Intensity @550 ± 5 nm | α@423 nm (cm$^{-1}$) | Integrated FTIR(cm$^{-2}$) | CL@423 nm/FTIR ratio | α@423 nm/FTIR ratio |
|----|---|---|---|---|---|---|---|
| S1 | 3.99 | 2.58 | 3.75 | 0.91 | 29.4 | 0.088 | 0.031 |
| S2 | 3.31 | 4.18 | 3.67 | 2.23 | 68.3 | 0.061 | 0.033 |
| S3 | 3.40 | 5.06 | 3.52 | 2.88 | 84.0 | 0.060 | 0.034 |
| S4 | 1.84 | 8.86 | 1.10 | 4.82 | 111.7 | 0.079 | 0.043 |

The units for each quantity are indicated in parentheses.

FIG. 8 shows the optical absorption coefficient α as a function of wavelength for each of samples S1 through S5, with the corresponding data for a commercial GaN LED-grade wafer, with a carrier concentration of about 1×10$^{18}$ cm$^{-3}$, grown by HYPE, for comparison. Specific values of the optical absorption coefficient α at a wavelength of 410 nm are also listed in Table 1. FIG. 8 and Table 1 show that as the oxygen concentration and the electron concentration increases, so too does the optical absorption. The slope of the optical absorption curves for the ammonothermal GaN samples changes at a wavelength of approximately 423 nm, consistent with the presence of a defect level at this energy and the CL behavior shown in FIG. 6. Although unimportant for device applications such as laser diodes and power electronics, for LED applications the oxygen and carrier concentrations in the substrates must be chosen to be low enough so that the substrate does not absorb a significant fraction of the emitted light. For typical LED device geometries this requirement appears to be met for oxygen concentrations below about 3×10$^{18}$ cm$^{-3}$, depending on the emission wavelength of the LED.

While the above is a full description of the specific embodiments, various modifications, alternative constructions and equivalents may be used. Therefore, the above description and illustrations should not be taken as limiting the scope of the present invention, which is defined by the appended claims.

What is claimed is:

1. A device, comprising:
    a gallium-containing nitride crystal substrate comprising gallium and nitrogen and having a wurtzite structure and comprising a first surface and a second surface opposite the first surface;
    at least one n-type epitaxial layer, at least one AlInGaN epitaxial layer, and at least one p-type epitaxial layer overlying at least a portion of the first surface;
    a p-contact disposed over at least a portion of the p-type epitaxial layer; and
    an n-contact,
    wherein the gallium-containing nitride crystal substrate comprises point defects having defect types and relative concentrations resulting in a compensation ratio between about 1.0 and about 4.0, said point defects being characterized by an absorbance per unit thickness of at least 0.01 cm$^{-1}$ at wavenumbers of approximately 3175 cm$^{-1}$, 3164 cm$^{-1}$, and 3150 cm$^{-1}$ and
    at wavenumbers between about 3200 cm$^{-1}$ and about 3400 cm$^{-1}$ and between about 3075 cm$^{-1}$ and about 3125 cm$^{-1}$, said gallium-containing nitride crystal substrate being essentially free of infrared absorption peaks having an absorbance per unit thickness greater than 10% of the absorbance per unit thickness at 3175 cm$^{-1}$.

2. The device of claim 1, wherein said first surface has a crystallographic orientation within about 5 degrees of a plane selected from a (0001) +c-plane or a (000-1) −c-plane;
    n type doping;
    an impurity concentration of hydrogen greater than about 5×10$^{17}$ cm$^{-3}$;
    an impurity concentration of oxygen between about 2×10$^{17}$ cm$^{-3}$ and about 1×10$^{20}$ cm$^{-3}$;
    an [H]/[O] ratio of at least 0.3; and
    an impurity concentration of at least one of Li, Na, K, Rb, Cs, Ca, F, and Cl greater than about 1×10$^{16}$ cm$^{-3}$.

3. The device of claim 1, wherein said gallium-containing nitride crystal substrate is characterized by a carrier concentration n between about 3×10$^{17}$ cm$^{-3}$ and about 1×10$^{20}$ cm$^{-3}$ and a carrier mobility η, in units of centimeters squared per volt-second, such that the logarithm to the base 10 of the quantity (1.2×η) is greater than about −0.4115[log10(n)]+ 10.028.

4. The device of claim 1, wherein said gallium-containing nitride crystal substrate is characterized by a carrier concentration between about 3×10$^{17}$ cm$^{-3}$ and about 5×10$^{19}$ cm$^{-3}$.

5. The device of claim 1, wherein said gallium-containing nitride crystal substrate is characterized by a compensation ratio between about 1.5 and about 3.5.

6. The device of claim 2, wherein the [H]/[O] ratio is between about 0.5 and about 1.3.

7. The device of claim 1, wherein said gallium-containing nitride crystal substrate is characterized by a cathodoluminescence peak at about 423 nm.

8. The device of claim 1, wherein said gallium-containing nitride crystal substrate is further characterized by a cathodoluminescence peak at about 550 nm.

9. The device of claim 1, wherein
the point defects are further characterized by an absorbance per unit thickness of at least 0.01 cm$^{-1}$ at a wavenumber of approximately 3188 cm$^{-1}$, wherein the absorbance per unit thickness at 3188 cm$^{-1}$ has a value between 5% and 25% of that of the absorbance per unit thickness at 3175 cm$^{-1}$.

10. The device of claim 1, wherein
said point defects are further characterized by an absorbance per unit thickness at wavenumbers from about 3188 cm$^{-1}$ to about 3400 cm$^{-1}$ that is less than 25% of that of the absorbance per unit thickness at 3175 cm$^{-1}$.

11. A device, comprising:
a gallium-containing nitride crystal substrate comprising gallium and nitrogen and having a wurtzite structure, comprising an n-type dopant, and further comprising a first surface and a second surface opposite the first surface;
at least one n-type epitaxial layer, at least one AlInGaN epitaxial layer, and at least one p-type epitaxial layer overlying at least a portion of the first surface;
a p-contact disposed over at least a portion of the p-type epitaxial layer; and
an n-contact,
wherein the gallium-containing nitride crystal substrate comprises:
impurities of hydrogen [H] and oxygen [O], wherein a ratio of an impurity concentration of hydrogen [H] to an impurity concentration of oxygen [O] is at least 0.3; and
impurities of at least one of Li, Na, K, Rb, Cs, Ca, F, and Cl having an impurity concentration of greater than about 1×10$^{16}$ cm$^{-3}$, wherein
a ratio of the impurity concentration of oxygen to an n-type carrier concentration n is between 1.0 and 4.0, and
at wavenumbers between about 3200 cm$^{-1}$ and about 3400 cm$^{-1}$, said gallium-containing nitride crystal substrate is essentially free of infrared absorption peaks having an absorbance per unit thickness greater than 0.01 cm$^{-1}$, as measured by Fourier transform infrared spectrometry (FTIR).

12. The device of claim 11, wherein at wavenumbers between about 3075 cm$^{-1}$ and about 3125 cm$^{-1}$, said gallium-containing nitride crystal substrate is essentially free of infrared absorption peaks having an absorbance per unit thickness greater than 0.01 cm$^{-1}$, as measured by Fourier transform infrared spectrometry.

13. The device of claim 11, wherein the gallium-containing nitride crystal substrate further comprises defects that are characterized by an absorbance per unit thickness of at least 0.01 cm$^{-1}$ at wavenumbers of approximately 3175 cm$^{-1}$, 3164 cm$^{-1}$, and 3150 cm$^{-1}$, as measured by Fourier transform infrared spectrometry.

14. The device of claim 11, wherein the gallium-containing nitride crystal substrate is characterized by an n-type carrier concentration n between about 3×10$^{17}$ cm$^{-3}$ and about 1×10$^{20}$ cm$^{-3}$ and by a carrier mobility η, in units of centimeters squared per volt-second, such that a logarithm to the base 10 of a quantity (1.2×η) is greater than about −0.4115[log$_{10}$(n)]+10.028.

15. The device of claim 11, wherein the gallium-containing nitride crystal substrate is characterized by an n-type carrier concentration n between about 3×10$^{17}$ cm$^{-3}$ and about 5×10$^{19}$ cm$^{-3}$.

16. The device of claim 11, wherein the gallium-containing nitride crystal substrate is characterized by a ratio of the impurity concentration of oxygen to the n-type carrier concentration n between about 1.5 and about 3.5.

17. The device of claim 1, wherein the gallium-containing nitride crystal substrate is characterized by a ratio of the impurity concentration of hydrogen to the impurity concentration of oxygen of between about 0.5 and about 1.3.

18. The device of claim 11, wherein the gallium-containing nitride crystal substrate is characterized by:
an impurity concentration of hydrogen [H] greater than about 5×10$^{17}$ cm$^{-3}$,
an impurity concentration of oxygen [O] between about 2×10$^{17}$ cm$^{-3}$ and about 1×10$^{20}$ cm$^{-3}$, wherein
the impurity concentrations are measured using calibrated secondary ion mass spectrometry (SIMS).

19. The device of claim 11, characterized by a cathodoluminescence peak at about 423 nm.

20. The device of claim 19, further characterized by a cathodoluminescence peak at about 550 nm.

* * * * *